US012588327B2

(12) United States Patent
Bae et al.

(10) Patent No.: US 12,588,327 B2
(45) Date of Patent: Mar. 24, 2026

(54) DISPLAY DEVICE AND METHOD FOR FABRICATION THEREOF

(71) Applicant: Samsung Display Co., LTD., Yongin-si (KR)

(72) Inventors: Sung Geun Bae, Hwaseong-si (KR); Jang Soon Park, Asan-si (KR); Hyun Wook Lee, Suwon-si (KR); Da Sol Jeong, Seoul (KR); Su Min Choi, Hwaseong-si (KR); Won Hyeong Heo, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 509 days.

(21) Appl. No.: 18/095,098

(22) Filed: Jan. 10, 2023

(65) Prior Publication Data

US 2023/0299239 A1     Sep. 21, 2023

(30) Foreign Application Priority Data

Mar. 18, 2022     (KR) ........................ 10-2022-0034026

(51) Int. Cl.
H10H 20/831 (2025.01)
H01L 25/075 (2006.01)
(Continued)

(52) U.S. Cl.
CPC ..... H10H 20/8312 (2025.01); H01L 25/0753 (2013.01); H10H 20/01 (2025.01); H10H 20/857 (2025.01); H10H 20/032 (2025.01)

(58) Field of Classification Search
CPC .... H10H 29/842; H10H 20/84; H10H 29/832; H10H 29/8321; H10H 20/83;
(Continued)

(56) References Cited

U.S. PATENT DOCUMENTS 11,626,537 B2 * 4/2023 Yun .................... H10H 20/8316
257/79
11,798,954 B2 10/2023 Chang et al.
(Continued)

FOREIGN PATENT DOCUMENTS

EP 3828930 6/2021
EP 4 246 577 9/2023
(Continued)

OTHER PUBLICATIONS

Extended European Search Report for European Application No. 23162711.8, dated Aug. 23, 2023.
(Continued)

*Primary Examiner* — Scott B Geyer
(74) *Attorney, Agent, or Firm* — Womble Bond Dickinson (US) LLP

(57) ABSTRACT

A display device and method for fabrication thereof are provided. The display device includes a first electrode and a second electrode spaced apart from the first electrode in a second direction, light emitting elements disposed on the first electrode and the second electrode, a first insulating layer disposed on the light emitting elements, a first connection electrode disposed on the first electrode and electrically contacting each of the light emitting elements, and a second connection electrode disposed on the second electrode and electrically contacting each of the light emitting elements, and the first insulating layer includes a first portion and a second portion having a thickness larger than a thickness of the first portion of the first insulating layer.

15 Claims, 32 Drawing Sheets

RME: RME1, RME2
CNE: CNE1, CNE2

(51) Int. Cl.
H10H 20/01 (2025.01)
H10H 20/857 (2025.01)

(58) Field of Classification Search
CPC .... H10H 20/831; H10H 29/14; H10H 29/142;
H01L 25/075; H01L 25/0753
See application file for complete search history.

(56) References Cited

U.S. PATENT DOCUMENTS

| | | | | |
|---|---|---|---|---|
| 11,842,988 | B2 * | 12/2023 | Kim | H01L 25/167 |
| 12,068,435 | B2 | 8/2024 | Shin et al. | |
| 2018/0019369 | A1 * | 1/2018 | Cho | H05K 1/181 |
| 2020/0176656 | A1 | 6/2020 | Bae et al. | |
| 2021/0384169 | A1 * | 12/2021 | Lee | H10H 20/857 |
| 2021/0391380 | A1 * | 12/2021 | Li | H10H 20/8506 |
| 2022/0068892 | A1 * | 3/2022 | Cha | H10H 20/857 |
| 2022/0068973 | A1 * | 3/2022 | Yun | H10H 29/30 |
| 2022/0069165 | A1 | 3/2022 | Shin et al. | |
| 2022/0085243 | A1 * | 3/2022 | Chang | H10D 86/021 |
| 2022/0109085 | A1 * | 4/2022 | Nam | H10H 20/853 |
| 2022/0199870 | A1 * | 6/2022 | Kim | H01L 25/0753 |
| 2022/0406840 | A1 * | 12/2022 | Lee | H01L 25/0753 |
| 2022/0415962 | A1 * | 12/2022 | Lee | H10H 20/84 |
| 2023/0187472 | A1 * | 6/2023 | Kim | H10H 20/84 |
| 2023/0299239 | A1 | 9/2023 | Bae et al. | |
| 2024/0379909 | A1 | 11/2024 | Shin et al. | |

FOREIGN PATENT DOCUMENTS

| | | | |
|---|---|---|---|
| KR | 10-2006-0106482 A | 10/2006 | |
| KR | 10-2021-0065238 A | 6/2021 | |
| KR | 10-2021-0075289 | 6/2021 | |
| KR | 10-2022-0026626 A | 3/2022 | |
| KR | 10-2023-0136819 | 9/2023 | |
| WO | WO-2020022596 A1 * | 1/2020 | H10H 20/84 |

OTHER PUBLICATIONS

Korean Office Action issued in corresponding KR Application No.
10-2022-0034026, dated Aug. 14, 2025, 10 pages.

* cited by examiner

NDA

10

DPA

DR1

DR2

RME: RME1, RME2
CNE: CNE1, CNE2

RME: RME1, RME2
CNE: CNE1, CNE2

RME: RME1, RME2
CNE: CNE1, CNE2

RME: RME1, RME2

RME: RME1, RME2

RME: RME1, RME2

RME: RME1, RME2

RME: RME1, RME2

RME: RME1, RME2

RME: RME1, RME2

RME: RME1, RME2

RME: RME1, RME2

RME: RME1, RME2
CNE: CNE1, CNE2

RME: RME1, RME2
CNE_2: CNE1_2, CNE2_2

RME: RME1, RME2
CNE: CNE1, CNE2

RME: RME1, RME2
CNE: CNE1, CNE2

RME: RME1, RME2
CNE: CNE1, CNE2

RME: RME1, RME2, RME3, RME4
CNE: CNE1, CNE2, CNE3, CNE4, CNE5
ED: ED1, ED2, ED3, ED4

RME: RME1, RME2, RME3, RME4
CNE: CNE1, CNE2, CNE3, CNE4

RME: RME1, RME2, RME3, RME4
CNE: CNE1, CNE2, CNE3, CNE4

RME: RME1, RME2, RME3, RME4
CNE: CNE1, CNE2, CNE3, CNE4

RME: RME1, RME2
CNE: CNE1, CNE2, CNE3
ED: ED1, ED2

DISPLAY DEVICE AND METHOD FOR FABRICATION THEREOF

CROSS-REFERENCE TO RELATED APPLICATION(S)

This application claims priority to and benefits of Korean Patent Application No. 10-2022-0034026 under 35 U.S.C. § 119 filed on Mar. 18, 2022 in the Korean Intellectual Property Office, the entire contents of which are incorporated herein by reference.

BACKGROUND

1. Technical Field

The disclosure relates to a display device and a method for fabrication thereof.

2. Description of the Related Art

The importance of display devices has steadily increased with the development of multimedia technology. In response thereto, various types of display devices such as an organic light emitting display (OLED), a liquid crystal display (LCD) and the like have been used.

As a device for displaying an image of a display device, there is a self-light emitting display device including a light emitting element. The self-light emitting display device may include an organic light emitting display device using an organic material as a light emitting material as a light emitting element, an inorganic light emitting display device using an inorganic material as a light emitting material, or the like.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device that prevents a connection failure between light emitting elements and connection electrodes, and a method for fabrication thereof.

However, aspects of the disclosure are not restricted to the ones set forth herein. The above and other aspects of the disclosure will become more apparent to one of ordinary skill in the art to which the disclosure pertains by referencing the detailed description of the disclosure given below.

According to an embodiment, a display device may include a first electrode and a second electrode spaced apart from the first electrode in a second direction; light emitting elements disposed on the first electrode and the second electrode; a first insulating layer disposed on the light emitting elements; a first connection electrode disposed on the first electrode and electrically contacting each of the light emitting elements; and a second connection electrode disposed on the second electrode and electrically contacting each of the light emitting elements, wherein the first insulating layer comprises a first portion and a second portion having a thickness larger than a thickness of the first portion of the first insulating layer.

A width of the first insulating layer may be equal to or less than a length of each of the light emitting elements.

A width of the second portion of the first insulating layer may be less than a width of the first insulating layer.

The second portion of the first insulating layer may be disposed at a center of the first insulating layer, and the first portion may be disposed on each of both sides of the second portion of the first insulating layer.

The first connection electrode may electrically contact a side surface of a first end of each of the light emitting elements, and a first side surface of the first portion, and the second connection electrode may electrically contact a side surface of each of a second end of the light emitting elements, and a second side surface of the first portion of the first insulating layer.

A part of each of the first connection electrode and the second connection electrode may be disposed on the first portion of the first insulating layer and spaced apart from the second portion of the first insulating layer.

The second portion of the first insulating layer may be disposed on a side in the second direction from a center of the second direction.

The first connection electrode may electrically contact a side surface of a first end of each of the light emitting elements and the first portion, and the second connection electrode may electrically contact a side surface of a second end of each of the light emitting elements and the second portion of the first insulating layer.

The first insulating layer may include a third portion having a thickness larger than a thickness of the second portion and having a width less than a width of the second portion of the first insulating layer.

The display device may further comprise a second insulating layer disposed on the first insulating layer, wherein the first connection electrode may contact the first insulating layer and the second insulating layer.

The display device may further comprise a first barrier wall that overlaps the first electrode in a plan view, and a second barrier wall that overlaps the second electrode in a plan view, wherein the light emitting elements and the first insulating layer may be disposed between the first barrier wall and the second barrier wall.

The display device may further comprise a lower insulating layer disposed on the first electrode and the second electrode, wherein the light emitting elements may be disposed directly on the lower insulating layer.

The display device may further comprise a third electrode disposed between the first electrode and the second electrode, and a fourth electrode spaced apart from the second electrode in the second direction, wherein the light emitting elements may comprise a first light emitting element disposed on the first electrode and the third electrode; and a second light emitting element disposed on the second electrode and the fourth electrode, and the first insulating layer may comprise a first insulating pattern disposed on the first light emitting element; and a second insulating pattern disposed on the second light emitting element.

The second portion may be disposed at a center of the first insulating layer in each of the first insulating pattern and the second insulating pattern.

The second portion may be disposed on a side in the second direction from a center in each of the first insulating pattern and the second insulating pattern.

According to an embodiment, a method for fabrication of a display device, may include preparing a first electrode and a second electrode spaced apart from each other, and a light emitting element disposed on the first electrode and the second electrode, and forming a first insulating material layer covering the light emitting element; forming a first photoresist pattern covering the light emitting element on the first insulating material layer, and etching a portion of the first insulating material layer not overlapping the first photoresist pattern in a plan view to form a second insulating material layer; and etching the second insulating material layer along a second photoresist pattern remaining after a part of the first photoresist pattern is removed to form a first insulating layer disposed on the light emitting element and comprising portions having different thicknesses.

A width of the first photoresist pattern may be greater than a length of the light emitting element.

The etching of the first insulating material layer may comprise removing a part of the first photoresist pattern to form the second photoresist pattern having a width less than a width of the first photoresist pattern.

The first insulating layer may comprise a first portion, and a second portion having a thickness larger than a thickness of the first portion, and a width of the first insulating layer may be equal to or less than a length of the light emitting element.

The display device may further comprise forming a first connection electrode disposed on the first electrode and electrically contacting the light emitting element, and a second connection electrode disposed on the second electrode and electrically the light emitting element, wherein the first connection electrode may electrically contact a side surface of a first end of the light emitting element, and a first side surface of the first portion, and the second connection electrode may electrically contact a side surface of a second end of the light emitting element, and a second side surface of the first portion.

In a display device according to one embodiment, an insulating layer disposed on light emitting elements may be formed through several etching processes, and a connection failure between the light emitting elements and connection electrodes may be prevented.

However, the effects of the disclosure are not limited to the aforementioned effects, and various other effects are included in the disclosure.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
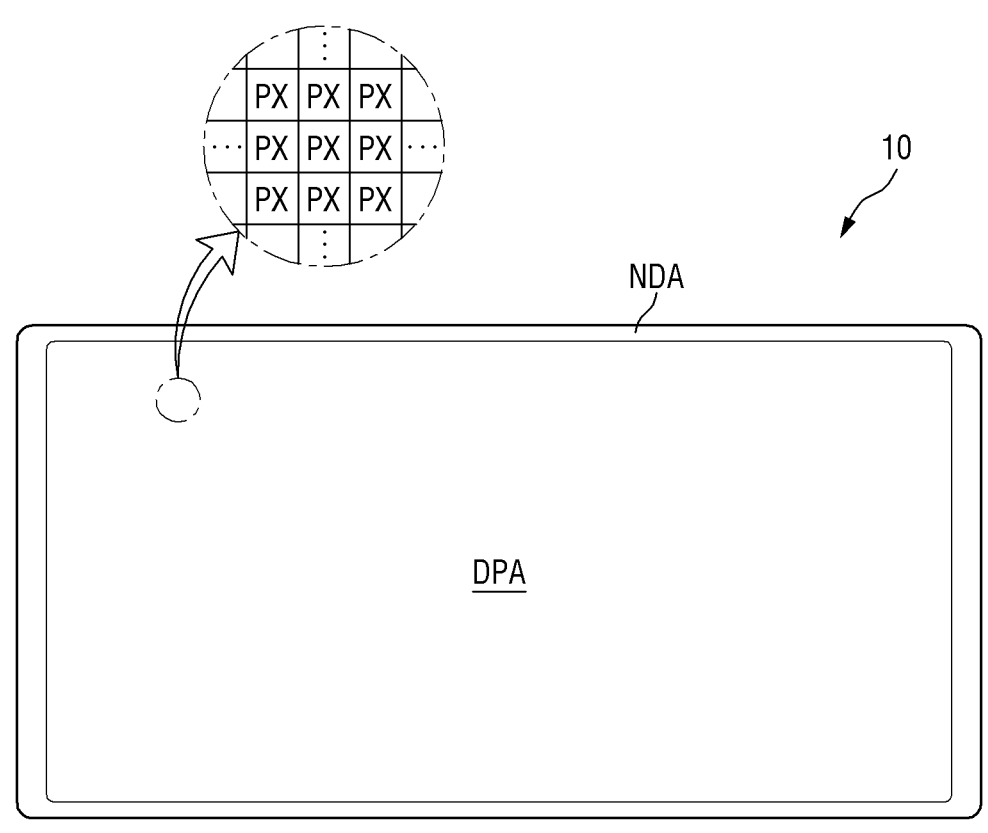
FIG. 1 is a schematic plan view of a display device according to one embodiment.
Figure 1:
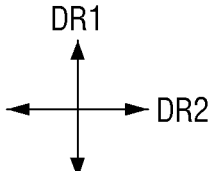

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

FIG. 1 is a schematic plan view of a display device according to one embodiment.

Referring to FIG. 1, a display device 10 displays a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 may include a display panel which provides a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel is applied as a display panel will be described, but the disclosure is not limited thereto, and other display panels may be applied within the same scope of technical spirit.

The shape of the display device 10 may be variously modified. For example, the display device 10 may have a shape such as a rectangular shape elongated in a horizontal direction, a rectangular shape elongated in a vertical direction, a square shape, a quadrilateral shape with rounded corners (vertices), another polygonal shape and a circular shape. The shape of a display area DPA of the display device 10 may also be similar to the overall shape of the display device 10. FIG. 1 illustrates the display device 10 having a rectangular shape elongated in a second direction DR2.

The display device 10 may include the display area DPA and a non-display area NDA. The display area DPA is an area where a screen can be displayed, and the non-display area NDA is an area where a screen is not displayed. The display area DPA may also be referred to as an active region, and the non-display area NDA may also be referred to as a non-active region. The display area DPA may substantially occupy the center of the display device 10.

The non-display area NDA may be disposed around the display area DPA. The non-display area NDA may completely or partially surround the display area DPA. The display area DPA may have a rectangular shape, and the non-display area NDA may be disposed adjacent to four sides of the display area DPA. The non-display area NDA may form a bezel of the display device 10. Wires or circuit drivers included in the display device 10 may be disposed in the non-display area NDA, or external devices may be mounted thereon.

Figure 2:
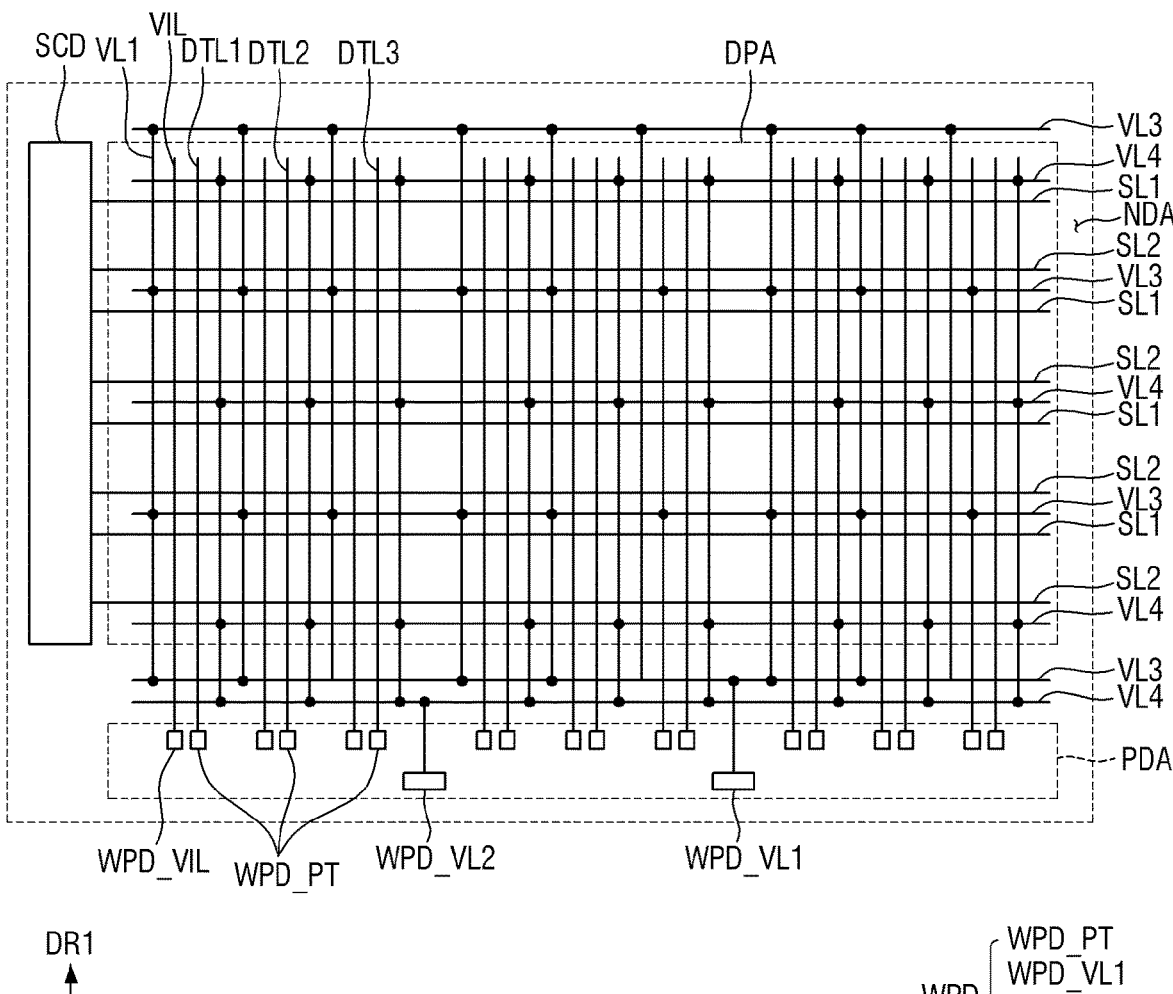
FIG. 2 is a schematic plan view illustrating schematic arrangement of wires of a display device according to one embodiment.

Referring to FIG. 2, the display device 10 may include wires. The display device 10 may include scan lines SL1 and SL2, data lines DTL1, DTL2, and DTL3, an initialization voltage line VIL, and voltage lines VL (VL1, VL2, VL3, and VL4). Although not shown in the drawing, other wires may be further provided in the display device 10. The wires may include wires formed of a first conductive layer and extending in a first direction DR1, and wires formed of a third conductive layer and extending in the second direction DR2. However, the extension directions of the wires are not limited thereto.

The first scan line SL1 and the second scan line SL2 may be disposed to extend in the second direction DR2. The first scan line SL1 and the second scan line SL2 in each pair may be spaced apart from each other in the first direction DR1, and multiple pairs of the first scan line DR1 and the second scan line SL2 may be repeatedly arranged or disposed in the first direction DR1. The first scan line SL1 and the second scan line SL2 may be electrically connected to a scan driver SCD disposed on one side or a side of the display area DPA in the second direction DR2. The first scan line SL1 and the second scan line SL2 may be disposed in the non-display area NDA to cross the display area DPA from the scan driver SCD in the second direction DR2.

The term "connected" as used herein may mean not only that one member is connected to another member through a physical contact, but also that one member is connected to another member through yet another member. This may also be understood as one part and the other part as integral elements are connected into an integrated element via another element. Furthermore, if one element is connected to another element, this may be construed as a meaning including an electrical connection via another element in addition to a direct connection in physical contact.

The data lines DTL may be disposed to extend in the first direction DR1. The data line DTL may include a first data line DTL1, a second data line DTL2, and a third data line DTL3, and each one of the first to third data lines DTL1, DTL2, and DTL3 may form a pair. The first to third data lines DTL1, DTL2, and DTL3 may be spaced apart from each other in the second direction DR2, and other wires may be disposed therebetween. Each of the data lines DTL1, DTL2, and DTL3 may be disposed to extend from the pad area PDA disposed in the non-display area NDA to the display area DPA.

The initialization voltage line VIL may be disposed to extend in the first direction DR1. The initialization voltage line VIL may be disposed between the data lines DTL and the first voltage line VL1. The initialization voltage line VIL may be disposed to extend in the first direction DR1 from the pad area PDA disposed in the non-display area NDA to the display area DPA.

The first voltage line VL1 and the second voltage line VL2 are disposed to extend in the first direction DR1, and the third voltage line VL3 and the fourth voltage line VL4 are disposed to extend in the second direction DR2. The first voltage line VL1 and the second voltage line VL2 may be alternately disposed in the second direction DR2, and the third voltage line VL3 and the fourth voltage line VL4 may be alternately disposed in the first direction DR1. The first voltage line VL1 and the second voltage line VL2 may be disposed to extend in the first direction DR1 to cross the display area DPA, and as for the third voltage line VL3 and the fourth voltage line VL4, some or a number of the wires may be disposed in the display area DPA and other wires may be disposed in the non-display area NDA positioned on both sides of the display area DPA in the first direction DR1, respectively. The first voltage line VL1 and the second voltage line VL2 may be formed of the first conductive layer, and the third voltage line VL3 and the fourth voltage line VL4 may be formed of the third conductive layer disposed on a layer different from the first conductive layer. The first voltage line VL1 may be connected to at least one third voltage line VL3, the second voltage line VL2 may be connected to at least one fourth voltage line VL4, and the voltage lines VL may have a mesh structure in the entire display area DPA. However, the disclosure is not limited thereto.

The data line DTL, the initialization voltage line VIL, the first voltage line VL1, and the second voltage line VL2 may be electrically connected to at least one line pad WPD. Each line pad WPD may be disposed in the non-display area NDA. In one embodiment, each of the line pads WPD may be disposed in the pad area PDA positioned on the lower side, which is the other side of the display area DPA in the first direction DR1. The data lines DTL are respectively connected to different data line pads WPD_PT. The initialization voltage line VIL is connected to an initialization line pad WPD_VIL, the first voltage line VL1 is connected to a first voltage line pad WPD_VL1, and the second voltage line VL2 is connected to a second voltage line pad WPD_VL2. The external devices may be mounted on the line pads WPD. The external devices may be mounted on the line pads WPD by applying an anisotropic conductive film, ultrasonic bonding or the like within the spirit and the scope of the disclosure. The drawing illustrates that each of the line pads WPD is disposed on the pad area PDA disposed on the lower side of the display area DPA, but is not limited thereto. Some or a number of the line pads WPD may be disposed in any one area on the upper side or on the left and right sides of the display area DPA.

Each pixel PX or sub-pixel SPXn (n is an integer of 1 to 3) of the display device 10 may include a pixel driving circuit. The above-described wires may pass through each pixel PX or the periphery thereof to apply a driving signal to each pixel driving circuit. The pixel driving circuit may include transistors and capacitors. The number of transistors and capacitors of each pixel driving circuit may be variously modified. According to one embodiment, in each sub-pixel SPXn of the display device 10, the pixel driving circuit may have a 3T1C structure including three transistors and one capacitor. Hereinafter, the pixel driving circuit of the 3T1C structure will be described as an example, but the disclosure is not limited thereto, and various other modified structures such as a 2T1C structure, a 7T1C structure, and a 6T1C structure may be applied.

Figure 3:
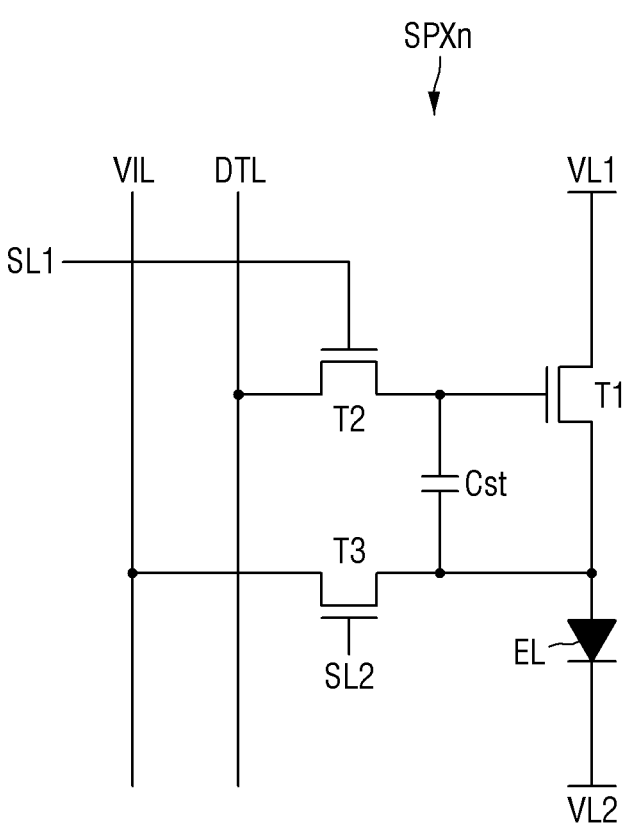
FIGS. 3 and 4 are pixel circuit diagrams of a sub-pixel disposed in a display device according to one embodiment.
Figure 4:
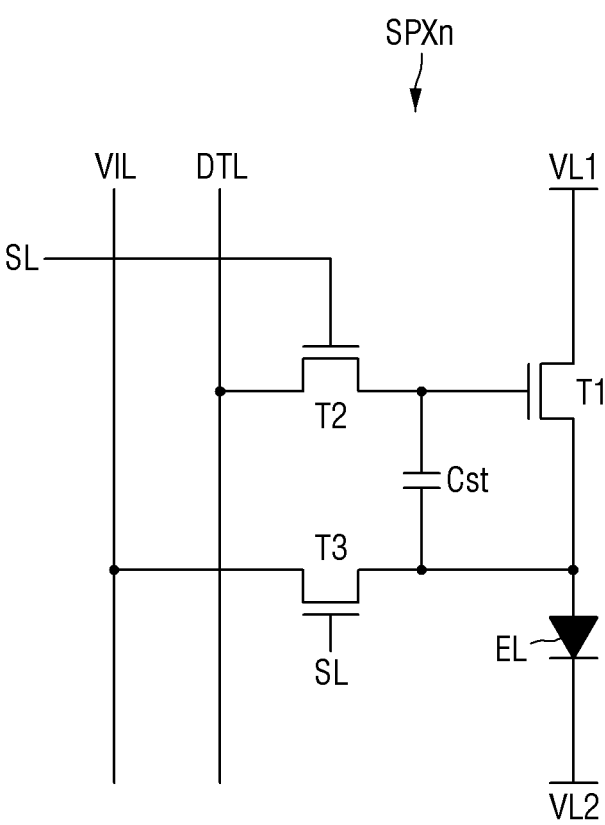

FIGS. 3 and 4 are pixel circuit diagrams of a sub-pixel disposed in a display device according to one embodiment.

Referring to FIG. 3, each sub-pixel SPXn of the display device 10 according to one embodiment may include three transistors T1, T2 and T3 and one storage capacitor Cst in addition to a light emitting diode EL.

The light emitting diode EL emits light by a current supplied through a first transistor T1. The light emitting diode EL may include a first electrode, a second electrode, and at least one light emitting element disposed between them. The light emitting element may emit light of a given wavelength band by electrical signals transmitted from the first electrode and the second electrode.

One end or an end of the light emitting diode EL may be connected to the source electrode of the first transistor T1, and the other end thereof may be connected to the second voltage line VL2 to which a low potential voltage (hereinafter, a second power voltage) lower than a high potential voltage (hereinafter, a first power voltage) of the first voltage line VL1 is supplied.

The first transistor T1 adjusts a current flowing from the first voltage line VL1, to which the first power voltage is supplied, to the light emitting diode EL according to the voltage difference between the gate electrode and the source electrode. For example, the first transistor T1 may be a driving transistor for driving the light emitting diode EL. The gate electrode of the first transistor T1 may be connected to the source electrode of the second transistor T2, the source electrode of the first transistor T1 may be connected to the first electrode of the light emitting diode EL, and the drain electrode of the first transistor T1 may be connected to the first voltage line VL1 to which the first power voltage is applied.

The second transistor T2 is turned on by a scan signal of a first scan line SL1 to connect the data line DTL to the gate electrode of the first transistor T1. The gate electrode of the second transistor T2 may be connected to the first scan line SL1, the source electrode thereof may be connected to the gate electrode of the first transistor T1, and the drain electrode thereof may be connected to the data line DTL.

The third transistor T3 is turned on by a scan signal of the second scan line SL2 to connect the initialization voltage line VIL to one end or an end of the light emitting diode EL. The gate electrode of the third transistor T3 may be connected to the second scan line SL2, the drain electrode thereof may be connected to the initialization voltage line VIL, and the source electrode thereof may be connected to one end or an end of the light emitting diode EL or to the source electrode of the first transistor T1.

In one embodiment, the source electrode and the drain electrode of each of the transistors T1, T2, and T3 are not limited to those described above, and vice versa. Each of the transistors T1, T2, and T3 may be formed of a thin film transistor. In FIG. 3, each of the transistors T1, T2, and T3 has been described as being formed of an N-type metal oxide semiconductor field effect transistor (MOSFET), but is not limited thereto. For example, each of the transistors T1, T2, and T3 may be formed of a P-type MOSFET. By way of example, some or a number of the transistors T1, T2, and T3 may be formed of an N-type MOSFET and the others may be formed of a P-type MOSFET.

The storage capacitor Cst is formed between the gate electrode and the source electrode of the first transistor T1. The storage capacitor Cst stores a difference voltage between a gate voltage and a source voltage of the first transistor T1.

In the embodiment of FIG. 3, the gate electrode of the second transistor T2 may be connected to the first scan line SL1, and the gate electrode of the third transistor T3 may be connected to the second scan line SL2. The first scan line SL1 and the second scan line SL2 may be different scan lines, and the second transistor T2 and the third transistor T3 may be turned on in response to scan signals applied from different scan lines. However, the disclosure is not limited thereto.

Referring to FIG. 4, the gate electrodes of the second transistor T2 and the third transistor T3 may be connected to a same scan line SL. The second transistor T2 and the third transistor T3 may be simultaneously turned on by a scan signal applied from a same scan line.

Figure 5:
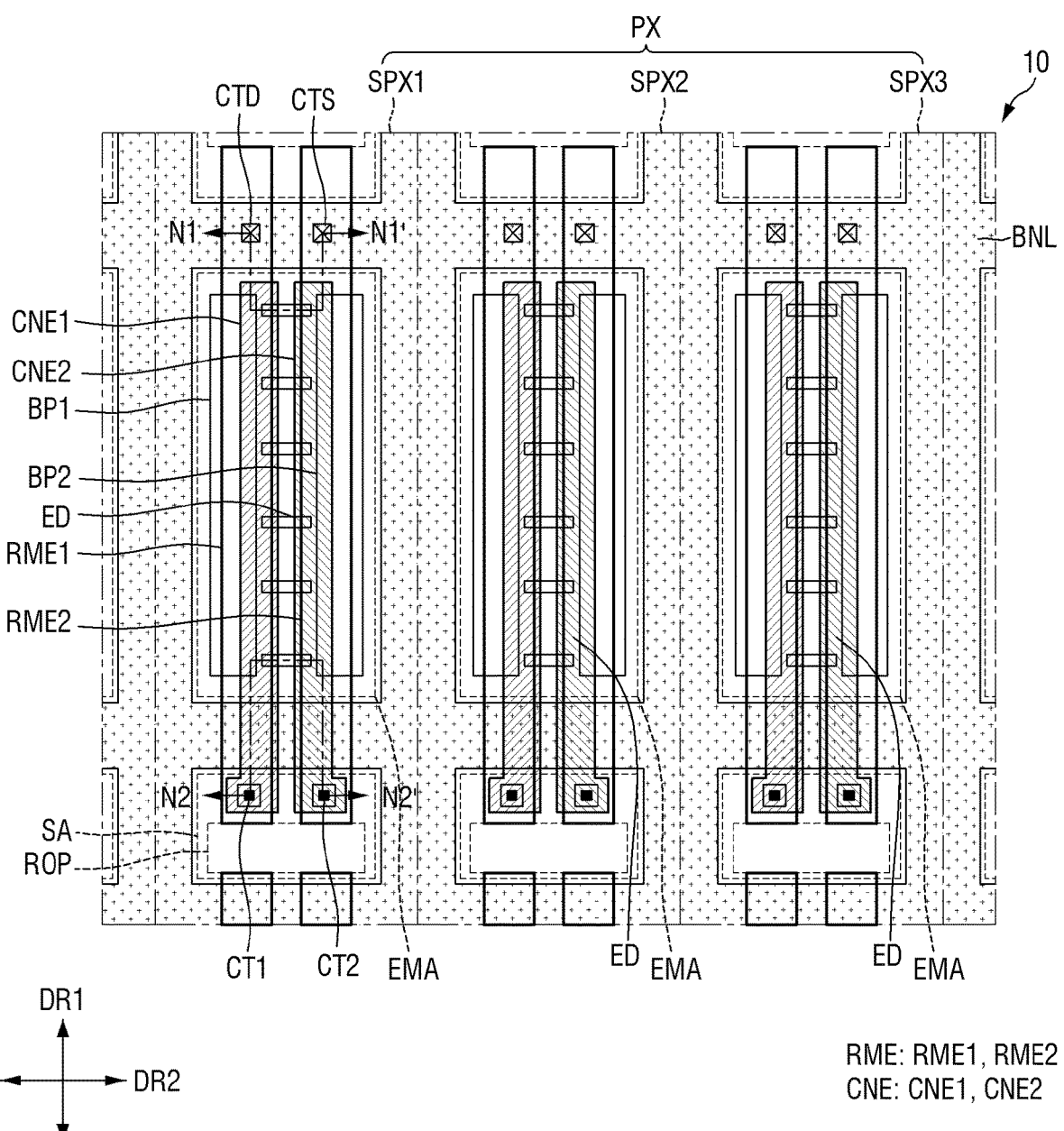
FIG. 5 is a schematic plan view illustrating one pixel of a display device according to one embodiment.

FIG. 5 is a schematic plan view illustrating one pixel of a display device according to one embodiment.

FIG. 5 illustrates planar arrangement of electrodes RME (RME1 and RME2), barrier walls BP1 and BP2, a bank layer BNL, light emitting elements ED, and connection electrodes CNE (CNE1 and CNE2) disposed in one pixel PX of the display device 10.

Referring to FIG. 5, each of the pixels PX of the display device 10 may include sub-pixels SPXn. For example, one pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. However, the disclosure is not limited thereto, and the sub-pixels SPXn may emit light of a same color. In one embodiment, each of the sub-pixels SPXn may emit blue light. Although it is illustrated in the drawing that one pixel PX may include three sub-pixels SPXn, the disclosure is not limited thereto, and the pixel PX may include a larger number of sub-pixels SPXn.

Each sub-pixel SPXn of the display device 10 may include an emission area EMA and a non-emission area. The emission area EMA may be an area in which the light emitting element ED is disposed to emit light of a given wavelength band. The non-emission area may be a region in which the light emitting element ED is not disposed and a region from which light is not emitted because light emitted from the light emitting element ED does not reach it.

The emission area EMA may include the region in which the light emitting element ED is disposed, and a region adjacent to the light emitting element ED in which the lights emitted from the light emitting element ED are emitted. For example, the emission area EMA may further include a region in which the light emitted from the light emitting element ED is reflected or refracted by another member and emitted. The light emitting elements ED may be disposed in each sub-pixel SPXn, and the emission area may be formed to include an area where the light emitting elements ED are disposed and an area adjacent thereto.

Although it is shown in the drawing that the sub-pixels SPXn have the emission areas EMA that are substantially identical in size, the disclosure is not limited thereto. In an embodiment, the emission areas EMA of the sub-pixels SPXn may have different sizes according to a color or wavelength band of light emitted from the light emitting element ED disposed in each sub-pixel.

Each sub-pixel SPXn may further include a sub-region SA disposed in the non-emission area. The sub-region SA of the corresponding sub-pixel SPXn may be disposed on the lower side of the emission area EMA, which is the other side in the first direction DR1. The emission area EMA and the sub-region SA may be alternately arranged along the first direction DR1, and the sub-region SA may be disposed between the emission areas EMA of different sub-pixels SPXn spaced apart from each other in the first direction DR1. For example, the emission area EMA and the sub-region SA may be alternately arranged in the first direction DR1, and each of the emission area EMA and the sub-region SA may be repeatedly arranged in the second direction DR2. However, the disclosure is not limited thereto, and the arrangement of the emission areas EMA and the sub-regions SA in the pixels PX may be different from that shown in FIG. 5.

Light may not be emitted from the sub-region SA because the light emitting element ED is not disposed in the sub-region SA, but an electrode RME disposed in each sub-pixel SPXn may be partially disposed in the sub-region SA. The electrodes RME disposed in different sub-pixels SPXn may be disposed to be separated at a separation portion ROP of the sub-region SA.

The display device 10 may include the electrodes RME (RME1 and RME2), the barrier walls BP1 and BP2, the bank layer BNL, the light emitting elements ED, and the connection electrodes CNE (CNE1 and CNE2).

The barrier walls BP1 and BP2 may be disposed in the emission area EMA of each sub-pixel SPXn. The barrier walls BP1 and BP2 may be disposed to extend substantially in the first direction DR1 and to be spaced apart from each other in the second direction DR2.

For example, the barrier walls BP1 and BP2 may include a first barrier wall BP1 and a second barrier wall BP2 spaced apart from each other in the second direction DR2 in the emission area EMA of each sub-pixel SPXn. The first barrier wall BP1 may be disposed on the left side with respect to the center of the emission area EMA, which is one side or a side in the second direction DR2, and the second barrier walls BP2 may be disposed on the right side with respect to the center of the emission area EMA, which is the other side in the second direction DR2, while being spaced apart from the first barrier wall BP1. The first barrier wall BP1 and the second barrier wall BP2 may be alternately disposed along the second direction DR2 and may be disposed in an island-shaped pattern in the display area DPA. The light emitting elements ED may be arranged between the first barrier wall BP1 and the second barrier wall BP2.

The lengths of the first barrier wall BP1 and the second barrier wall BP2 in the first direction DR1 may be the same, and may be smaller than the length of the emission area EMA surrounded by the bank layer BNL in the first direction DR1. The first barrier wall BP1 and the second barrier wall BP2 may be spaced apart from a portion of the bank layer BNL extending in the second direction DR2. However, the disclosure is not limited thereto, and the barrier walls BP1 and BP2 may be integrated with the bank layer BNL, or may partially overlap the portion of the bank layer BNL extending in the second direction DR2. The lengths of the barrier walls BP1 and BP2 in the first direction DR1 may be greater than or equal to the length of the emission area EMA surrounded by the bank layer BNL in the first direction DR1.

Although it is illustrated in the drawing that two barrier walls BP1 and BP2 are arranged for each sub-pixel SPXn, the disclosure is not limited thereto. The number and the shape of the barrier walls BP1 and BP2 may vary depending on the number or the arrangement structure of the electrodes RME.

The electrodes RME (RME1 and RME2) have a shape extending in one direction or a direction and are disposed for each sub-pixel SPXn. The electrodes RME1 and RME2 may extend in the first direction DR1 to be disposed across the emission area EMA of the sub-pixel SPXn and the sub-region SA, and may be disposed to be spaced apart from each other in the second direction DR2. The electrodes RME may be electrically connected to the light emitting elements ED to be described later. However, the disclosure is not limited thereto, and the electrodes RME may not be electrically connected to the light emitting element ED.

The display device 10 may include the first electrode RME1 and the second electrode RME2 arranged in each sub-pixel SPXn. The first electrode RME1 may be located or disposed on the left side with respect to the center of the emission area EMA, and the second electrode RME2 is located on the right side with respect to the center of the emission area EMA while being spaced apart from the first electrode RME1 in the second direction DR2. A first electrode RME1 may be disposed on the first barrier wall BP1, and a second electrode RME2 may be disposed on the second barrier wall BP2. The first electrode RME1 and the second electrode RME2 may be partially arranged in the corresponding sub-pixel SPXn and the sub-region SA over the bank layer BNL. The first electrode RME1 and the second electrode RME2 of different sub-pixels SPXn may be spaced apart or separated from each other at the separation portion ROP located in the sub-region SA of one sub-pixel SPXn.

Although it is illustrated in the drawing that two electrodes RME have a shape extending in the first direction DR1 for each sub-pixel SPXn, the disclosure is not limited thereto. For example, the display device 10 may have a shape in which a larger number of electrodes RME are disposed in one sub-pixel SPXn or the electrodes RME are partially bent and have different widths depending on positions.

The bank layer BNL may be disposed to surround the sub-pixels SPXn, the emission area EMA, and the sub-region SA. The bank layer BNL may be disposed at the boundary between the sub-pixels SPXn adjacent in the first direction DR1 and the second direction DR2, and may also be disposed at the boundary between the emission area EMA and the sub-region SA. The sub-pixels SPXn, the emission area EMA, and the sub-region SA of the display device 10 may be the areas distinguished by the arrangement of the bank layer BNL. The gaps between the sub-pixels SPXn, the emission areas EMA, and the sub-regions SA may vary depending on the width of the bank layer BNL.

The bank layer BNL may include portions extending in the first direction DR1 and the second direction DR2 in a plan view to be arranged in a grid pattern over the entire surface of the display area DPA. The bank layer BNL may be disposed along the boundaries between the sub-pixels SPXn to delimit the neighboring sub-pixels SPXn. The bank layer BNL may also be arranged to surround the emission area EMA and the sub-region SA disposed for each sub-pixel SPXn to delimit them from each other. As will be described later, the bank layer BNL may form an area in which color control structures of the display device 10 are disposed.

The light emitting elements ED may be arranged in the emission area EMA. The light emitting elements ED may be disposed between the barrier walls BP1 and BP2, and may be arranged to be spaced apart from each other in the first direction DR1. In one embodiment, the light emitting elements ED may have a shape extending in one direction or a direction, and both ends thereof may be disposed on different electrodes RME. The length of the light emitting element ED may be greater than the gap between the electrodes RME spaced apart from each other in the second direction DR2. The extension direction of the light emitting elements ED may be substantially perpendicular to the first direction DR1 in which the electrodes RME extend. However, the disclosure is not limited thereto, and the light emitting element ED may extend in the second direction DR2 or in a direction oblique to the second direction DR2.

The connection electrodes CNE (CNE1 and CNE2) may be disposed on the electrodes RME and the barrier walls BP1 and BP2. The connection electrodes CNE may have a shape extending in one direction or a direction, and may be disposed to be spaced apart from each other. Each of the connection electrodes CNE may be in contact with the light emitting element ED, and may be electrically connected to the electrode RME or a conductive layer thereunder.

The connection electrodes CNE may include the first connection electrode CNE1 and the second connection electrode CNE2 disposed in each sub-pixel SPXn. The first connection electrode CNE1 may have a shape extending in the first direction DR1 and may be disposed on the first electrode RME1 or the first barrier wall BP1. The first connection electrode CNE1 may partially overlap the first electrode RME1 and may be disposed across the emission area EMA and the sub-region SA over the bank layer BNL. The second connection electrode CNE2 may have a shape extending in the first direction DR1 and may be disposed on the second electrode RME2 or the second barrier wall BP2. The second connection electrode CNE2 may partially overlap the second electrode RME2 and may be disposed across the emission area EMA and the sub-region SA over the bank layer BNL.

Figure 6:
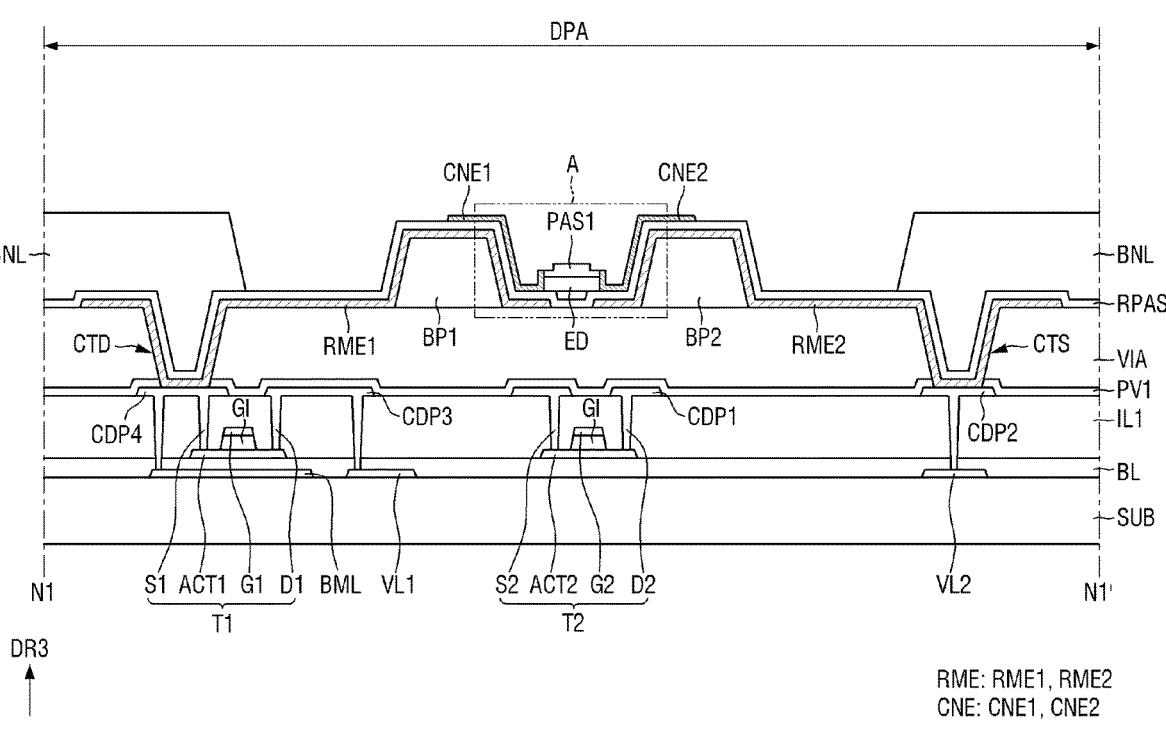
FIG. 6 is a schematic cross-sectional view taken along line N1-N1' of FIG. 5.
Figure 7:
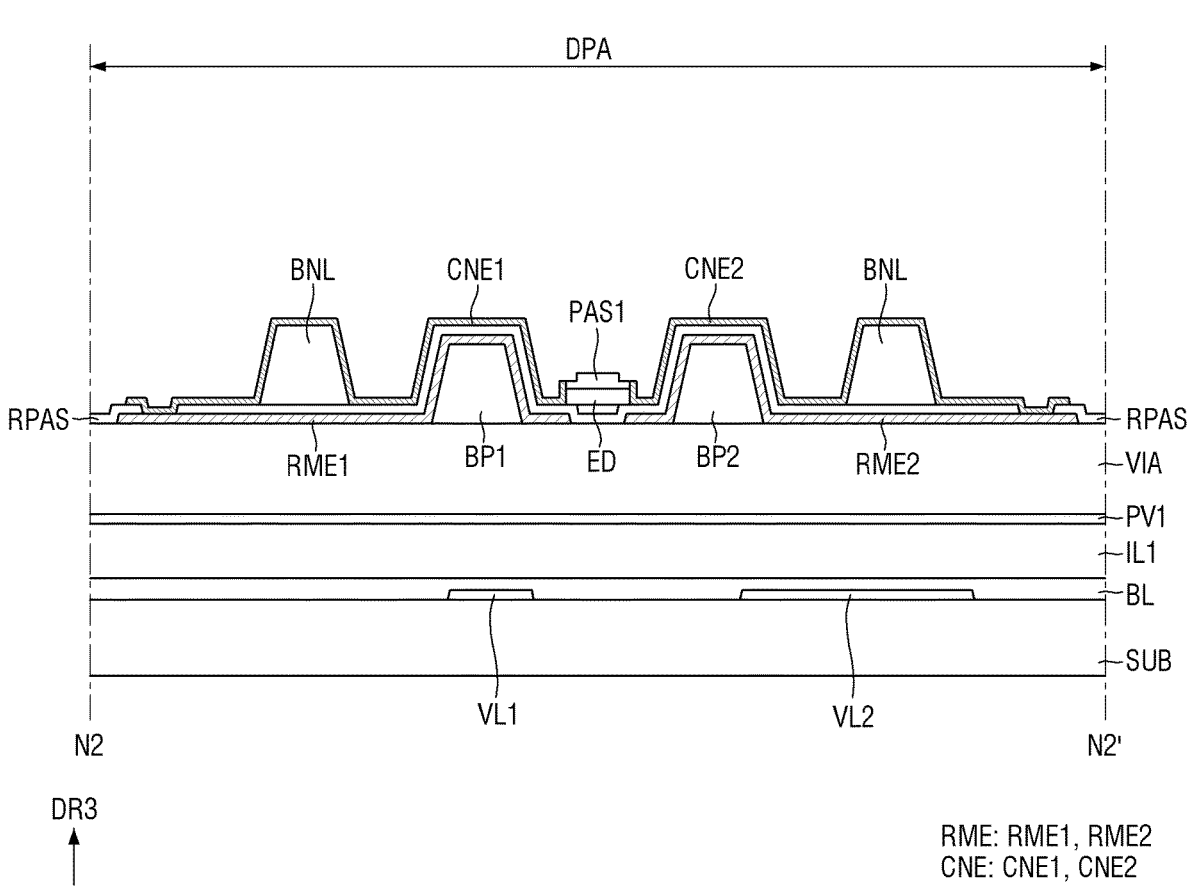
FIG. 7 is a schematic cross-sectional view taken along line N2-N2' of FIG. 5.

FIG. 6 is a schematic cross-sectional view taken along line N1-N1' of FIG. 5. FIG. 7 is a schematic cross-sectional view taken along line N2-N2' of FIG. 5.

FIG. 6 illustrates a schematic cross section across both ends of the light emitting element ED and electrode contact holes CTD and CTS disposed in the first sub-pixel SPX1, and FIG. 7 illustrates a cross section across both ends of the light emitting element ED and contact portions CT1 and CT2 disposed in the first sub-pixel SPXn.

The cross-sectional structure of the display device 10 is described with reference to FIGS. 6 and 7 in conjunction with FIG. 5. The display device 10 may include a first substrate SUB, and a semiconductor layer, conductive layers, and insulating layers disposed thereon. The display device 10 may include the electrodes RME (RME1 and RME2), the light emitting element ED, and the connection electrodes CNE (CNE1 and CNE2). The semiconductor layer, the conductive layers, and the insulating layers may each constitute a circuit layer of the display device 10.

The first substrate SUB may be an insulating substrate. The first substrate SUB may be made of an insulating material such as glass, quartz, or polymer resin. Further, the first substrate SUB may be a rigid substrate, but may be a flexible substrate which can be bent, folded or rolled. The first substrate SUB may include the display area DPA and the non-display area NDA surrounding the display area DPA, and the display area DPA may include the emission area EMA and the sub-region SA that is a part of the non-emission area.

A first conductive layer may be disposed on the first substrate SUB. The first conductive layer may include a lower metal layer BML, a first voltage line VL1, and a second voltage line VL2. The lower metal layer BML may be arranged to overlap an active layer ACT1 of a first transistor T1. The lower metal layer BML may prevent light from entering the first active layer ACT1 of the first transistor T1, or may be electrically connected to the first active layer ACT1 to stabilize electrical characteristics of the first transistor T1. However, the lower metal layer BML may be omitted.

The first voltage line VL1 may be applied with a high potential voltage (or a first power voltage) transmitted to a first electrode RME1, and the second voltage line VL2 may be applied with a low potential voltage (or a second power voltage) transmitted to a second electrode RME2. The first voltage line VL1 may be electrically connected to the first the first transistor T1 through a conductive pattern (for example, a third conductive pattern CDP3) of a third conductive layer. The second voltage line VL2 may be electrically connected to the second electrode RME2 through a conductive pattern (for example, a second conductive pattern CDP2) of a third conductive layer.

Although the drawing illustrates that the first voltage line VL1 and the second voltage line VL2 are disposed on a first conductive layer, the disclosure is not limited thereto. In an embodiment, the first voltage line VL1 and the second voltage line VL2 may be disposed on the third conductive layer and may be directly electrically connected to the first transistor T1 and the second electrode RME2, respectively.

A buffer layer BL may be disposed on the first conductive layer and the first substrate SUB. The buffer layer BL may be formed on the first substrate SUB to protect the transistors of the pixel PX from moisture permeating through the first substrate SUB susceptible to moisture permeation, and may perform a surface planarization function.

The semiconductor layer is disposed on the buffer layer BL. The semiconductor layer may include the first active layer ACT1 of the first transistor T1 and a second active layer ACT2 of the second transistor T2. The first active layer ACT1 and the second active layer ACT2 may be disposed to partially overlap a first gate electrode G1 and a second gate electrode G2 of a second conductive layer to be described later, respectively.

The semiconductor layer may include polycrystalline silicon, monocrystalline silicon, oxide semiconductor, and the like within the spirit and the scope of the disclosure. In an embodiment, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IGZTO).

Although it is illustrated in the drawing that one first transistor T1 is disposed in the sub-pixel SPXn of the display device 10, but the disclosure is not limited thereto, and the display device 10 may include a larger number of transistors.

The first gate insulating layer GI is disposed on the semiconductor layer. The first gate insulating layer GI may serve as a gate insulating layer of each of the transistors T1 and T2. Although it is illustrated in the drawing that the first gate insulating layer GI is patterned together with the gate electrodes G1 and G2 of the second conductive layer to be described later and partially disposed between the second conductive layer and the active layers ACT1 and ACT2 of the semiconductor layer, the disclosure is not limited thereto. In an embodiment, the first gate insulating layer GI may be entirely disposed on the buffer layer BL.

The second conductive layer is disposed on the first gate insulating layer GI. The second conductive layer may include a first gate electrode G1 of the first transistor T1 and a second gate electrode G2 of the second transistor T2. The first gate electrode G1 may be disposed to overlap the channel region of the first active layer ACT1 in a third direction DR3 that is a thickness direction, and the second gate electrode G2 may be disposed to overlap the channel region of the second active layer ACT2 in the third direction DR3 that is the thickness direction. Although not shown in the drawing, the second conductive layer may further include one electrode of the storage capacitor.

A first interlayer insulating layer IL1 is disposed on the second conductive layer. The first interlayer insulating layer IL1 may function as an insulating film between the second conductive layer and other layers disposed thereon, and may protect the second conductive layer.

A third conductive layer is disposed on the first interlayer insulating layer ILL The third conductive layer may include conductive patterns CDP1, CDP2, and CDP3, and CDP4 and source electrodes S1 and S2 and drain electrodes D1 and D2 of the respective transistors T1 and T2. Some or a number of the conductive patterns CDP1, CDP2, and CDP3 may electrically connect conductive layers or semiconductor layers of different layers to each other and may serve as source or drain electrodes of the transistors T1 and T2.

The first conductive pattern CDP1 may be in contact with the first active layer ACT1 of the first transistor T1 through the contact hole penetrating the first interlayer insulating layer ILL The first conductive pattern CDP1 may be in contact with the lower metal layer BML through a contact hole penetrating the first interlayer insulating layer IL1 and the buffer layer BL. The first conductive pattern CDP1 may serve as a first source electrode S1 of the first transistor T1. The first conductive pattern CDP1 may be electrically connected to the first electrode RME1 or the first connection electrode CNE1. The first transistor T1 may transmit the first power voltage applied from the first voltage line VL1 to the first electrode RME1 or the first connection electrode CNE1.

The second conductive pattern CDP2 may be in contact with the second voltage line VL2 through a contact hole penetrating the first interlayer insulating layer IL1 and the buffer layer BL. The second conductive pattern CDP2 may be electrically connected to the first electrode RME1 or the first connection electrode CNE1. The second voltage line VL2 may transmit the second power voltage to the second electrode RME2 or the second connection electrode CNE2.

The third conductive pattern CDP3 may be in contact with the first voltage line VL1 through a contact hole penetrating the first interlayer insulating layer IL1 and the buffer layer BL. Further, the third conductive pattern CDP3 may be in contact with the first active layer ACT1 of the first transistor T1 through the contact hole penetrating the first interlayer insulating layer ILL The third conductive pattern CDP3 may electrically connect the first voltage line VL1 to the first transistor T1 and may serve as the first drain electrode D1 of the first transistor T1.

The second source electrode S2 and the second drain electrode D2 may be in contact with the second active layer ACT2 of the second transistor T2 through the contact holes penetrating the first interlayer insulating layer ILL The second transistor T2 may transmit a data signal to the first transistor T1 or transmit an initialization signal.

A first passivation layer PV1 is disposed on the third conductive layer. The first passivation layer PV1 may function as an insulating layer between the third conductive layer and other layers and may protect the third conductive layer.

The buffer layer BL, the first gate insulating layer GI, the first interlayer insulating layer IL1, and the first passivation layer PV1 described above may be formed of inorganic layers stacked in an alternating manner. For example, the buffer layer BL, the first gate insulating layer GI, the first interlayer insulating layer IL1, and the first passivation layer PV1 may be formed as a double layer formed by stacking, or a multilayer formed by alternately stacking, inorganic layers including at least one of silicon oxide ($SiO_x$), silicon nitride ($SiN_x$), or silicon oxynitride ($SiO_xN_y$). However, the disclosure is not limited thereto, and the buffer layer BL, the first gate insulating layer GI, the first interlayer insulating layer ILL and the first passivation layer PV1 may be formed as a single inorganic layer containing the above-described insulating material. Further, in an embodiment, the first interlayer insulating layer IL1 may be made of an organic insulating material such as polyimide (PI) or the like within the spirit and the scope of the disclosure.

A via layer VIA is disposed on the third conductive layer in the display area DPA. The via layer VIA may contain an organic insulating material, for example, polyimide (PI), and may compensate the stepped portion formed by the conductive layers disposed thereunder to flatten the top surface. However, in an embodiment, the via layer VIA may be omitted.

The display device 10 may include, as a display element layer disposed on the via layer VIA, the barrier walls BP1 and BP2, the electrodes RME (RME1 and RME2), the bank layer BNL, the light emitting elements ED, and the connection electrodes CNE (CNE1 and CNE2). The display device 10 may include insulating layers RPAS and PAS1 disposed on the via layer VIA.

The barrier walls BP1 and BP2 may be disposed on the via layer VIA. For example, the barrier walls BP1 and BP2 may be disposed on or directly disposed on the via layer VIA, and may have a structure in which at least a portion thereof protrudes with respect to the top surface of the via layer VIA. The protruding portions of the barrier walls BP1 and BP2 may have an inclined surface or a curved surface with a curvature, and the light emitted from the light emitting element ED may be reflected by the electrode RME disposed on the barrier walls BP1 and BP2 and emitted in the upward direction of the via layer VIA. Unlike the example illustrated in the drawing, the barrier walls BP1 and BP2 may have a shape, for example, a semicircular or semi-elliptical shape, in which the outer surface is curved with a curvature in cross-sectional view. The barrier walls BP1, BP2, and BP3 may include an organic insulating material such as polyimide (PI), but is not limited thereto.

The electrodes RME (RME1 and RME2) may be disposed on the barrier walls BP1 and BP2 and the via layer VIA. For example, the first electrode RME1 and the second electrode RME2 may be arranged at least on the inclined surfaces of the barrier walls BP1 and BP2. The widths of the electrodes RME measured in the second direction DR2 may be smaller than the widths of the barrier walls BP1 and BP2 measured in the second direction DR2, and the gap between the first electrode RME1 and the second electrode RME2 in the second direction DR2 may be smaller than the gap between the barrier walls BP1 and BP2. At least a part of the first electrode RME1 and the second electrode RME2 may be arranged on or directly arranged on the via layer VIA, so that the first electrode RME1 and the second electrode RME2 may be arranged on a same plane.

The light emitting element ED disposed between the barrier walls BP1 and BP2 may emit light toward both ends, and the emitted light may be directed toward the electrodes RME disposed on the barrier walls BP1 and BP2. The electrodes RME may have a structure in which portions thereof disposed on the barrier walls BP1 and BP2 may reflect the light emitted from the light emitting element ED. The first electrode RME1 and the second electrode RME2 may be arranged to cover at least one side or a side surfaces of the barrier walls BP1 and BP2 and may reflect the light emitted from the light emitting element ED.

The electrodes RME may be in direct contact with the third conductive layer through the electrode contact holes CTD and CTS at the portions overlapping the bank layer BNL between the emission area EMA and the sub-region SA. The first electrode contact hole CTD may be formed in an area in which the bank layer BNL and the first electrode RME1 overlap, and the second electrode contact hole CTS may be formed in an area in which the bank layer BNL and the second electrode RME2 overlap. The first electrode RME1 may be in contact with the first conductive pattern CDP1 through the first electrode contact hole CTD penetrating the via layer VIA and the first passivation layer PV1. The second electrode RME2 may be in contact with the second voltage line VL2 through the second electrode contact hole CTS penetrating the via layer VIA and the first passivation layer PV1. The first electrode RME1 may be electrically connected to the first transistor T1 through the first conductive pattern CDP1, so that the first power voltage may be applied to the first electrode RME1, and the second electrode RME2 may be electrically connected to the second voltage line VL2, so that the second power voltage may be applied to the second electrode RME2. However, the disclosure is not limited thereto. In an embodiment, the electrodes RME1 and RME2 may not be electrically connected to the voltage lines VL1 and VL2 of the third conductive layer, respectively, and the connection electrode CNE to be described later may be connected to or directly connected to the third conductive layer.

The electrodes RME may include a conductive material having high reflectivity. For example, the electrodes RME may contain a metal such as silver (Ag), copper (Cu), or aluminum (Al), or may contain an alloy including aluminum (Al), nickel (Ni), lanthanum (La), or the like within the spirit and the scope of the disclosure. By way of example, the electrodes RME may have a structure in which a metal layer such as titanium (Ti), molybdenum (Mo), and niobium (Nb) and the alloy may be stacked each other. In an embodiment, the electrodes RME may be formed as a double layer or a multilayer formed by stacking at least one metal layer made of an alloy including aluminum (Al) and titanium (Ti), molybdenum (Mo), and niobium (Nb).

The disclosure is not limited thereto, and each electrode RME may further include a transparent conductive material. For example, each electrode RME may include a material such as ITO, IZO, and ITZO. In an embodiment, each of the electrodes RME may have a structure in which at least one transparent conductive material and at least one metal layer having high reflectivity may be stacked each other, or may be formed as one layer or a layer including them. For example, each electrode RME may have a stacked structure of ITO/Ag/ITO, ITO/Ag/IZO, ITO/Ag/ITZO/IZO, or the like within the spirit and the scope of the disclosure. The electrodes RME may be electrically connected to the light emitting element ED, and may reflect some or a number of the lights emitted from the light emitting element ED in an upward direction of the first substrate SUB.

A lower insulating layer RPAS may be disposed across the entire surface of the display area DPA, and may be disposed on the via layer VIA and the electrodes RME. The lower insulating layer RPAS may include an insulating material to protect the electrodes RME and insulate electrodes RME different from each other. The lower insulating layer RPAS is disposed to cover the electrodes RME before the bank layer BNL is formed, so that it is possible to prevent the electrodes RME from being damaged in a process of forming the bank layer BNL. Further, the lower insulating layer RPAS may prevent the light emitting element ED disposed thereon from being damaged by direct contact with other members.

In an embodiment, the lower insulating layer RPAS may have stepped portions such that the top surface thereof is partially depressed between the electrodes RME spaced apart in the second direction DR2. The light emitting element ED may be disposed on the top surface of the lower insulating layer RPAS, where the stepped portions are formed, and thus a space may remain between the light emitting element ED and the lower insulating layer RPAS.

The lower insulating layer RPAS may include the contact portions CT1 and CT2 disposed in the sub-region SA. The contact portions CT1 and CT2 may be disposed to overlap different electrodes RME, respectively. For example, the contact portions CT1 and CT2 may include first contact portions CT1 disposed to overlap the first electrode RME1 and second contact portions CT2 disposed to overlap the second electrode RME2. The first contact portions CT1 and the second contact portions CT2 may penetrate the lower insulating layer RPAS to partially expose the top surface of the first electrode RME1 or the second electrode RME2 thereunder. Each of the first contact portion CT1 and the second contact portion CT2 may further penetrate some or a number of the other insulating layers disposed on the lower insulating layer RPAS. The electrode RME exposed by each of the contact portions CT1 and CT2 may be in contact with the connection electrode CNE.

The bank layer BNL may be disposed on the lower insulating layer RPAS. The bank layer BNL may include portions extending in the first direction DR1 and the second direction DR2, and may surround the sub-pixels SPXn. The bank layer BNL may surround and distinguish the emission area EMA and the sub-region SA of each sub-pixel SPXn, and may surround the outermost part of the display area DPA and distinguish the display area DPA and the non-display area NDA.

Similar to the barrier walls BP1 and BP2, the bank layer BNL may have a height. In an embodiment, the top surface of the bank layer BNL may be higher than that of the barrier walls BP1 and BP2, and the thickness of the bank layer BNL may be equal to or greater than that of the barrier walls BP1 and BP2. The bank layer BNL may prevent ink from overflowing to adjacent sub-pixels SPXn in an inkjet printing process during the fabrication process of the display device 10. Similar to the barrier walls BP1 and BP2, the bank layer BNL may include an organic insulating material such as polyimide.

The light emitting elements ED may be arranged in the emission area EMA. The light emitting elements ED may be disposed on the lower insulating layer RPAS between the barrier walls BP1 and BP2. The light emitting element ED may be disposed so that one extension direction thereof is parallel with the top surface of the first substrate SUB. As will be described later, the light emitting element ED may include semiconductor layers arranged along one direction or a direction in which the light emitting element ED extends, and the semiconductor layers may be sequentially arranged along the direction parallel with the top surface of the first substrate SUB. However, the disclosure is not limited thereto, and the semiconductor layers may be arranged in the direction perpendicular to the first substrate SUB in case that the light emitting element ED has another structure.

The light emitting elements ED disposed in each sub-pixel SPXn may emit light of different wavelength bands depending on a material constituting the semiconductor layer. However, the disclosure is not limited thereto, and the light emitting elements ED arranged in each sub-pixel SPXn may include the semiconductor layer of a same material or a similar material and emit light of a same color.

The light emitting elements ED may be electrically connected to the electrode RME and the conductive layers below the via layer VIA while being in contact with the connection electrodes CNE (CNE1 and CNE2), and may emit light of a given wavelength band by receiving an electrical signal.

The first insulating layer PAS1 may be disposed on the light emitting elements ED. The first insulating layer PAS1 may be disposed to surround the outer surface of the light emitting element ED. The first insulating layer PAS1 may extend in the first direction DR1 between the barrier walls BP1 and BP2 to form a pattern disposed on the light emitting elements ED, and may form a linear or island-like pattern in each sub-pixel SPXn in a plan view. The first insulating layer PAS1 may protect the light emitting elements ED while fixing the light emitting elements ED during the fabrication process of the display device 10. In an embodiment, the first insulating layer PAS1 may be disposed to fill the space between the light emitting element ED and the lower insulating layer RPAS thereunder.

The connection electrodes CNE (CNE1 and CNE2) may be disposed on the electrodes RME and the barrier walls BP1 and BP2. The first connection electrode CNE1 may be disposed on the first electrode RME1 and the first barrier wall BP1. The first connection electrode CNE1 may partially overlap the first electrode RME1 and may be disposed across the emission area EMA and the sub-region SA over the bank layer BNL. The second connection electrode CNE2 may be disposed on the second electrode RME2 and the second barrier wall BP2. The second connection electrode CNE2 may partially overlap the second electrode RME2 and may be disposed across the emission area EMA and the sub-region SA over the bank layer BNL.

The first connection electrode CNE1 and the second connection electrode CNE2 may be respectively in contact with the light emitting elements ED. The first connection electrode CNE1 may partially overlap the first electrode RME1 and may be in contact with one of ends of the light emitting elements ED. The second connection electrode CNE2 may partially overlap the second electrode RME2 and may be in contact with the other ends of the light emitting elements ED. The connection electrodes CNE are disposed across the emission area EMA and the sub-region SA. The connection electrodes CNE may be in contact with the light emitting elements ED at portions disposed in the emission area EMA, and may be electrically connected to the third conductive layer at portions disposed in the sub-region SA. The first connection electrode CNE1 may be in contact with a first end of the light emitting element ED, and the second connection electrode CNE2 may be in contact with a second end of the light emitting element ED.

In accordance with one embodiment, in the display device 10, the connection electrodes CNE may be in contact with the electrode RME through the contact portions CT1 and CT2 disposed in the sub-region SA. The first connection electrode CNE1 may be in contact with the first electrode RME1 in the sub-region SA through the first contact portion CT1 penetrating the lower insulating layer RPAS. The second connection electrode CNE2 may be in contact with the second electrode RME2 in the sub-region SA through the second contact portion CT2 penetrating the lower insulating layer RPAS. Each of the connection electrodes CNE may be electrically connected to the third conductive layer through each of electrodes RME. The first connection electrode CNE1 may be electrically connected to the first transistor T1, so that the first power voltage may be applied to the first connection electrode CNE1, and the second connection electrode CNE2 may be electrically connected to the second voltage line VL2, so that the second power voltage may be applied to the second connection electrode CNE2. Each connection electrode CNE may be in contact with the light emitting element ED in the emission area EMA to transmit the power voltage to the light emitting element ED.

However, the disclosure is not limited thereto. In an embodiment, the connection electrodes CNE may be in direct contact with the third conductive layer, and may be electrically connected to the third conductive layer through patterns other than the electrodes RME.

The connection electrodes CNE may include a conductive material. For example, they may include ITO, IZO, ITZO, aluminum (Al), or the like within the spirit and the scope of the disclosure. As an example, the connection electrodes CNE may include a transparent conductive material, and light emitted from the light emitting element ED may pass through the connection electrodes CNE to be emitted.

Although not illustrated in the drawings, another insulating layer may be further disposed on the connection electrodes CNE1 and CNE2. The insulating layer may function to protect the members disposed on the first substrate SUB against the external environment.

Each of the lower insulating layer RPAS and the first insulating layer PAS1 described above may include an inorganic insulating material or an organic insulating material. For example, each of the lower insulating layer RPAS and the first insulating layer PAS1 may include an inorganic insulating material. By way of example, the lower insulating layer RPAS may include an inorganic insulating material, whereas the first insulating layer PAS1 may include an organic insulating material. Each or at least either one of the lower insulating layer RPAS and the first insulating layer PAS1 may be formed to have a structure in which multiple insulating layers may be stacked each other alternately or repeatedly. In an embodiment, each of the lower insulating layer RPAS and the first insulating layer PAS1 may be any one of silicon oxide ($SiO_x$), silicon nitride ($SiN_x$), and silicon oxynitride ($SiO_xN_y$). The lower insulating layer RPAS, the first insulating layer PAS1, and the third insulating layer PAS3 may be made of a same material or a similar material or different materials. By way of example, some or a number of them may be made of a same material or a similar material and some or a number of them may be made of different materials.

Figure 8:
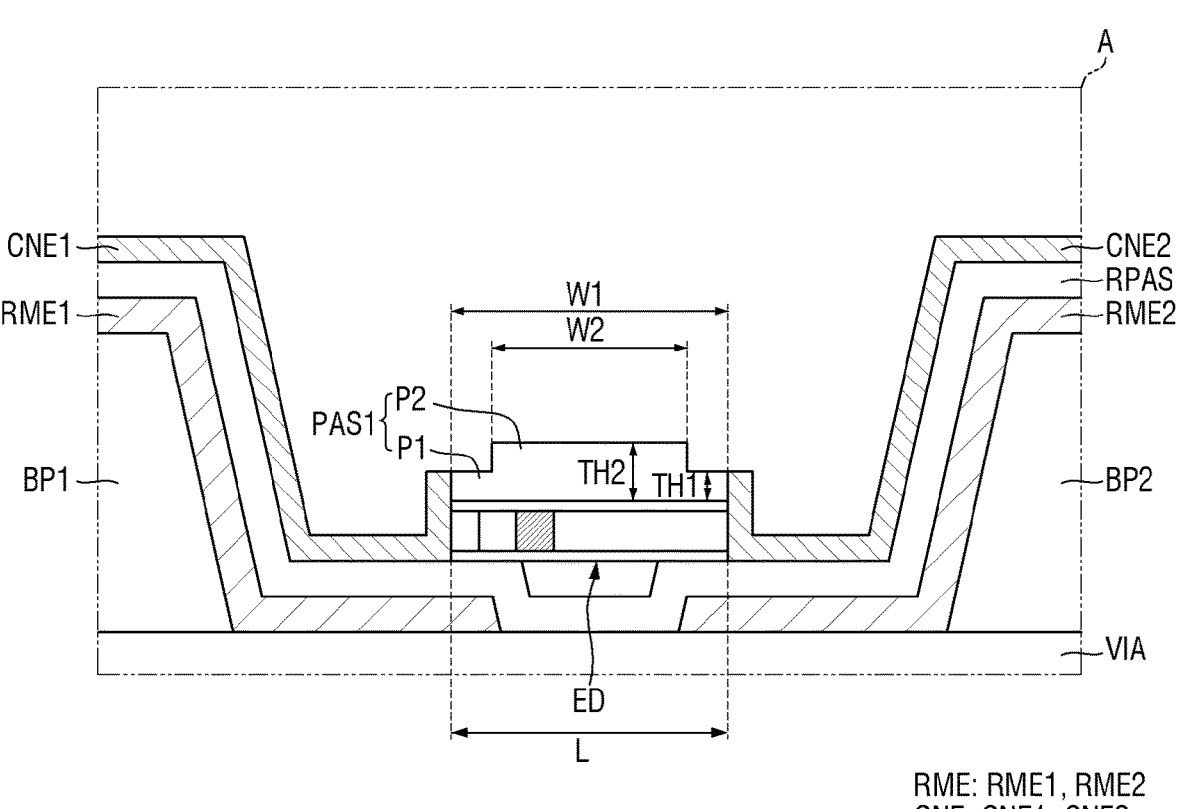
FIG. 8 is an enlarged view of part A of FIG. 6.

FIG. 8 is an enlarged view of part A of FIG. 6. FIG. 8 illustrates an enlarged view illustrating the shape of the light emitting element ED and the first insulating layer PAS1 disposed thereon.

Referring to FIG. 8, the display device 10 according to one embodiment may include the first insulating layer PAS1 having portions P1 and P2 with different thicknesses. The first insulating layer PAS1 may have the first portion P1 with a relatively small thickness TH1 and the second portion P2 with a thickness TH2 larger than that of the first portion P1. The first insulating layer PAS1 may have a non-uniform thickness and have a stepped shape with a protruding portion, and may extend along the first direction DR1 in which the light emitting elements ED are arranged. In one embodiment, the second portion P2 having the large thickness may be disposed at the central portion of the first insulating layer PAS1, and the first insulating layer PAS1 may have a shape in which the central portion thereof protrudes higher than the peripheral portion thereof.

The first insulating layer PAS1 may fix the light emitting elements ED, and may be disposed such that both end surfaces of the light emitting elements ED are exposed. In one embodiment, a width W1 of the first insulating layer PAS1 may be equal to or less than the length of the light emitting element ED. In one embodiment in which the light emitting element ED has a shape extending in one direction or a direction and is disposed such that the extension direction thereof is parallel to the second direction DR2, the first insulating layer PAS1 may not cover both side surfaces of the light emitting element ED in the extension direction. Both exposed side surfaces of the light emitting element ED may be respectively in contact with the connection electrodes CNE1 and CNE2. In the drawings, the width W1 of the first insulating layer PAS1 is illustrated to be equal to a length L of the light emitting element ED, but the disclosure is not limited thereto. The width W1 of the first insulating layer PAS1 may be less than the length L of the light emitting element ED. At both ends of the light emitting element ED, the top surface (or outer surface) thereof as well as both side surfaces thereof may be partially exposed in cross-sectional view.

In the first insulating layer PAS1, a width W2 of the second portion P2 having the large thickness may be smaller than the whole width W1 of the first insulating layer PAS1. The width W2 of the second portion P2 may be smaller than the length L of the light emitting element ED. The width W2 of the second portion P2 may be smaller than the width W1 of the first insulating layer PAS1, and the first insulating layer PAS1 may have, besides the second portion P2, the first portion P1 having the thickness TH1 smaller than the thickness TH2 of the second portion P2.

The connection electrode CNE may be in contact with both exposed side surfaces of the light emitting element ED, and a part thereof may also be in contact with the first insulating layer PAS1. The first connection electrode CNE1 may be in contact with a side surface of the first end of the light emitting element ED, and may be in contact with a first side surface of the first insulating layer PAS1 parallel to the side surface of the first end. The second connection electrode CNE2 may be in contact with a side surface of the second end of the light emitting element ED, and may be in contact with a second side surface of the first insulating layer PAS1 parallel to the side surface of the second end. The first and second side surfaces of the first insulating layer PAS1 in contact with the first connection electrode CNE1 and the second connection electrode CNE2 may be side surfaces of the first portion P1. The distance between the first connection electrode CNE1 and the second connection electrode CNE2 may be equal to the width W1 of the first insulating layer PAS1. In the drawings, it is illustrated that the second portion P2 of the first insulating layer PAS1 is disposed at the central portion of the first insulating layer PAS1, and the first portion P1 is positioned at both sides of the second portion P2. Accordingly, both side surfaces of the first insulating layer PAS1 may be the side surfaces of the first portion P1, and each of the connection electrodes CNE may be in contact with the first portion P1.

However, the disclosure is not limited thereto. In an embodiment, as the second portion P2 is disposed to be biased to one side or a side, one side surface or a side surface of the first insulating layer PAS1 may be the side surface of the first portion P1, whereas the other side surface opposite thereto may be the side surface of the second portion P2. Each of the individual connection electrodes CNE may be in contact with the first portion P1 and the second portion P2 of the first insulating layer PAS1. In an embodiment, the connection electrodes CNE may be in direct contact with the top surface of the first insulating layer PAS1.

The first insulating layer PAS1 may be formed by forming an insulating material layer covering the light emitting elements ED and patterning the insulating material layer. In the display device 10 according to one embodiment, the patterning process may be performed by being divided into two or more processes, and, thus, the first insulating layer PAS1 may have the shape including the portions P1 and P2 with the different thicknesses. As the first insulating layer PAS1 is formed through the multiple patterning processes, it is possible to prevent any one end or an end of the light emitting element ED from not being exposed or the connection electrodes CNE from being in contact with each other in case that the overlay of the patterning process is misaligned. By way of example, if the first insulating layer PAS1 is formed by etching the insulating material layer through one patterning process to match the length of the light emitting element ED, any one end or an end of the light emitting element ED may not be exposed as the position of a photoresist pattern for the patterning of the insulating material layer is different from a design value. On the other hand, if the photoresist pattern is formed to cover the light emitting element ED and the insulating material layer is patterned through multiple etching processes, the process of etching the insulating material layer may be performed until both end surfaces of the light emitting element ED are exposed, without being affected by the size and the position of the photoresist pattern. Accordingly, even if the photoresist pattern is formed at a position deviated from the design value, at least the first insulating layer PAS1 may be formed not to cover both ends of the light emitting element ED.

As the display device 10 according to one embodiment may include the first insulating layer PAS1 formed through the above-described process, a connection failure between the light emitting element ED and the connection electrode CNE may be prevented. Since the first insulating layer PAS1 is formed through the multiple patterning processes, it may be given the shape in which the step is formed due to the different thicknesses. A description thereof will be given later with reference to other drawings.

Figure 9:
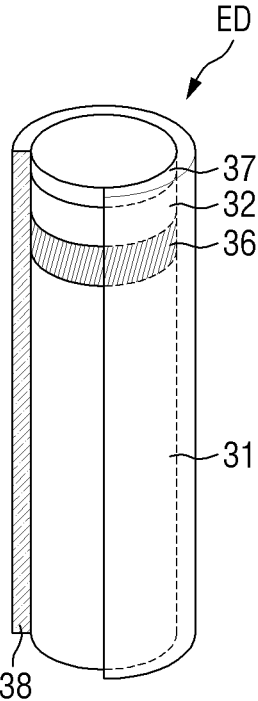
FIG. 9 is a schematic diagram of a light emitting element according to one embodiment.

FIG. 9 is a schematic diagram of a light emitting element according to one embodiment.

Referring to FIG. 9, the light emitting element ED may be a light emitting diode. By way of example, the light emitting element ED may be an inorganic light emitting diode that has a nanometer or micrometer size, and is made of an inorganic material. The light emitting element ED may be aligned between two electrodes having polarity in case that an electric field is formed in a given direction between two electrodes facing each other.

The light emitting element ED according to one embodiment may have a shape elongated in one direction or a direction. The light emitting element ED may have a shape of a cylinder, a rod, a wire, a tube, or the like within the spirit and the scope of the disclosure. However, the shape of the light emitting element ED is not limited thereto, and the light emitting element ED may have a polygonal prism shape such as a regular cube, a rectangular parallelepiped and a hexagonal prism, or may have various shapes such as a shape elongated in one direction or a direction and having an outer surface partially inclined.

The light emitting element ED may include a semiconductor layer doped with any conductivity type (for example, p-type or n-type) dopant. The semiconductor layer may emit light of a given wavelength band by receiving an electrical signal applied from an external power source. The light emitting element ED may include a first semiconductor layer 31, a second semiconductor layer 32, a light emitting layer 36, an electrode layer 37 and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \le x \le 1$, $0 \le y \le 1$, $0 \le x+y \le 1$). For example, the first semiconductor layer 31 may be any one or more of AlGaInN, GaN, AlGaN, InGaN, AlN and InN doped with an n-type dopant. The n-type dopant doped into the first semiconductor layer 31 may be Si, Ge, Sn, Se, or the like within the spirit and the scope of the disclosure.

The second semiconductor layer 32 is disposed on the first semiconductor layer 31 with the light emitting layer 36 therebetween. The second semiconductor layer 32 may be a p-type semiconductor, and the second semiconductor layer 32 may include a semiconductor material having a chemical formula of $Al_xGa_yIn_{1-x-y}N$ ($0 \le x \le 1$, $0 \le y \le 1$, $0 \le x+y \le 1$). For example, the second semiconductor layer 32 may be any one or more of AlGaInN, GaN, AlGaN, InGaN, AlN and InN doped with a p-type dopant. The p-type dopant doped into the second semiconductor layer 32 may be Mg, Zn, Ca, Ba, or the like within the spirit and the scope of the disclosure.

Although it is illustrated in the drawing that the first semiconductor layer 31 and the second semiconductor layer 32 are one layer or a layer, the disclosure is not limited thereto. Depending on the material of the light emitting layer 36, the first semiconductor layer 31 and the second semiconductor layer 32 may further include a larger number of layers, such as a cladding layer or a tensile strain barrier reducing (TSBR) layer. For example, the light emitting element ED may further include another semiconductor layer disposed between the first semiconductor layer 31 and the light emitting layer 36 or between the second semiconductor layer 32 and the light emitting layer 36. The semiconductor layer disposed between the first semiconductor layer 31 and the light emitting layer 36 may be one or more of AlGaInN, GaN, AlGaN, InGaN, AlN, InN and SLs doped with an n-type dopant, and the semiconductor layer disposed between the second semiconductor layer 32 and the light emitting layer 36 may be one or more of AlGaInN, GaN, AlGaN, InGaN, AlN and InN doped with a p-type dopant.

The light emitting layer 36 is disposed between the first semiconductor layer 31 and the second semiconductor layer 32. The light emitting layer 36 may include a material having a single or multiple quantum well structure. In case that the light emitting layer 36 may include a material having a multiple quantum well structure, quantum layers and well layers may be stacked each other alternately. The light emitting layer 36 may emit light by coupling of electron-hole pairs according to an electrical signal applied through the first semiconductor layer 31 and the second semiconductor layer 32. The light emitting layer 36 may include a material such as AlGaN, AlGaInN, or InGaN. In case that the light emitting layer 36 has a multiple quantum well structure in which quantum layers and well layers may be alternately stacked each other, the quantum layer may include a material such as AlGaN or AlGaInN, and the well layer may include a material such as GaN or AlInN.

The light emitting layer 36 may have a structure in which semiconductor materials having large band gap energy and semiconductor materials having small band gap energy may be alternately stacked each other, and may include other group III to V semiconductor materials according to the wavelength band of the emitted light. The light emitted by the light emitting layer 36 is not limited to the light of the blue wavelength band, but the light emitting layer 36 may also emit light of a red or green wavelength band in some cases.

The electrode layer 37 may be an ohmic connection electrode. However, the disclosure is not limited thereto, and it may be a Schottky connection electrode. The light emitting element ED may include at least one electrode layer 37. The light emitting element ED may include one or more electrode layers 37, but the disclosure is not limited thereto, and the electrode layer 37 may be omitted.

In the display device 10, in case that the light emitting element ED is electrically connected to an electrode or a connection electrode, the electrode layer 37 may reduce the resistance between the light emitting element ED and the electrode or connection electrode. The electrode layer 37 may include a conductive metal. For example, the electrode layer 37 may include at least one of aluminum (Al), titanium (Ti), indium (In), gold (Au), silver (Ag), ITO, IZO, or ITZO.

The insulating film 38 is arranged to surround the outer surfaces of the semiconductor layers and electrode layers described above. For example, the insulating film 38 may be disposed to surround at least the outer surface of the light emitting layer 36, and may be formed to expose both ends of the light emitting element ED in the longitudinal direction. Further, in cross-sectional view, the insulating film 38 may have a top surface, which is rounded in a region adjacent to at least one end or an end of the light emitting element ED.

The insulating film 38 may include at least one of materials having insulating properties, for example, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$). It is illustrated in the drawing that the insulating film 38 is formed as a single layer, but the disclosure is not limited thereto. In an embodiment, the insulating film 38 may be formed in a multilayer structure having layers stacked therein.

The insulating film 38 may perform a function of protecting the semiconductor layers and the electrode layer of the light emitting element ED. The insulating film 38 may prevent an electrical short circuit that is likely to occur at the light emitting layer 36 in case that an electrode to which an electrical signal is transmitted is in direct contact with the light emitting element ED. The insulating film 38 may prevent a decrease in luminous efficiency of the light emitting element ED.

Further, the insulating film 38 may have an outer surface which is surface-treated. The light emitting elements ED may be aligned in such a way of spraying the ink in which the light emitting elements ED are dispersed on the electrodes. Here, the surface of the insulating film 38 may be treated to have a hydrophobic property or hydrophilic property in order to keep the light emitting elements ED in the dispersed state without being aggregated with other adjacent light emitting elements ED in the ink.

Hereinafter, a fabrication process of the display device 10 will be described with reference to other drawings.

FIGS. 10 to 18 are schematic cross-sectional views sequentially illustrating a fabrication process of a display device according to one embodiment. In FIGS. 10 to 18, a process of forming the first insulating layer PAS1 of the display device 10 is sequentially illustrated in schematic cross-sectional views. The structures illustrated in FIGS. 10 to 18 may correspond to the structure of FIG. 8.

Figure 10:
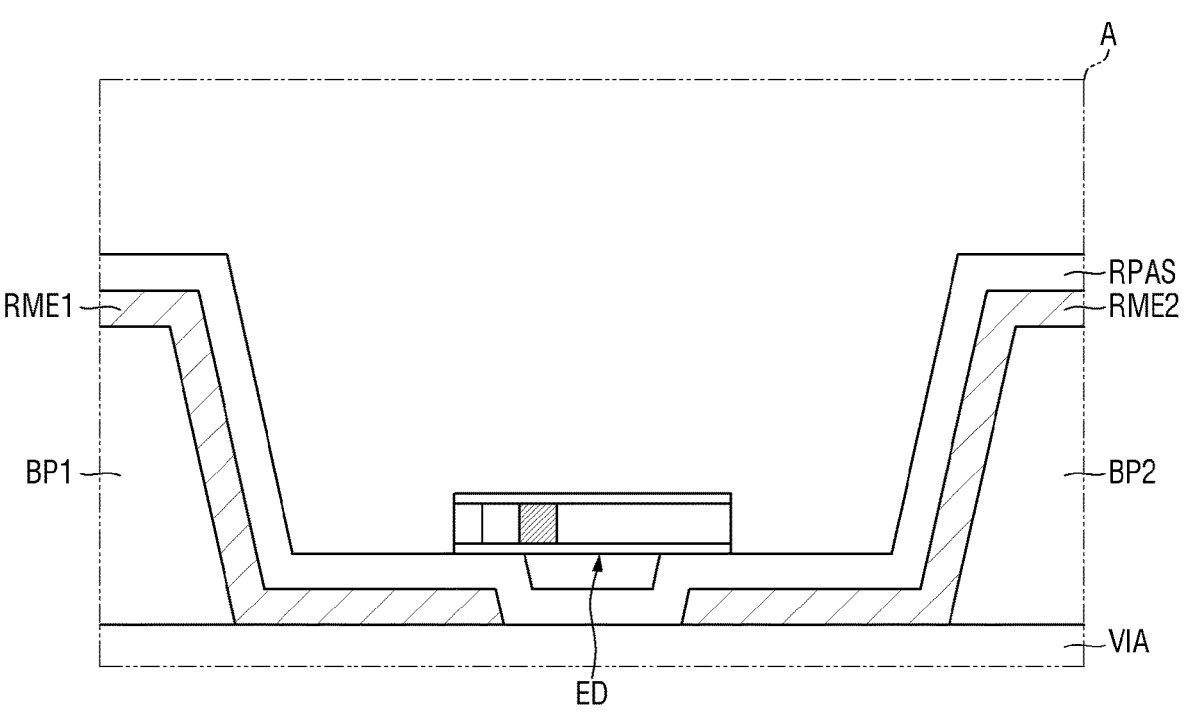
FIGS. 10 to 18 are schematic cross-sectional views sequentially illustrating a fabrication process of a display device according to one embodiment.

Referring to FIG. 10, the first substrate SUB is prepared, and the first to third conductive layers, the buffer layer BL, the first gate insulating layer GI, the first interlayer insulating layer IL1, the via layer VIA, the barrier walls BP1 and BP2, the electrode RME, the lower insulating layer RPAS, and the light emitting elements ED are disposed on the first substrate SUB.

The first to third conductive layers and the electrodes RME disposed on the first substrate SUB may be formed by depositing a material, for example, a metal material, of each of the layers, and performing a patterning process using a mask. The buffer layer BL, the first gate insulating layer GI, the first interlayer insulating layer ILL the via layer VIA, the barrier walls BP1 and BP2, the first insulating layer PAS1, and the bank layer BNL that are disposed on the first substrate SUB may be formed by applying a material constituting each layer, for example, an insulating material, or, if necessary, through a patterning process using a mask. A description of the structure of the layers disposed on the first substrate SUB is the same as described above.

In an embodiment, the light emitting elements ED may be disposed on the electrode RME by an inkjet printing process. In case that an electrical signal is applied to the electrodes RME after an ink in which the light emitting elements ED are dispersed is sprayed into the area surrounded by the bank layer BNL, the light emitting elements ED in the ink may be placed on the electrodes RME while changing their own positions and orientation directions.

Figure 11:
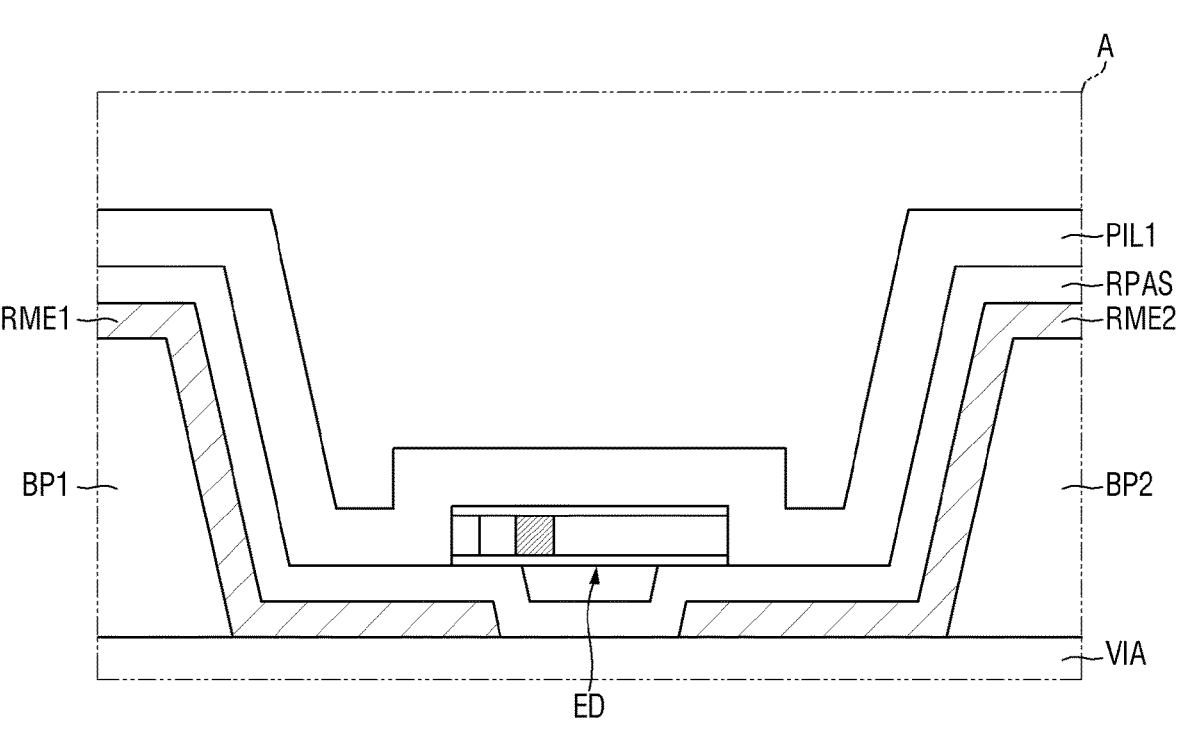

Referring to FIG. 11, a first insulating material layer PIL1 is formed on the light emitting elements ED. The first insulating material layer PIL1 may be entirely disposed on the lower insulating layer RPAS and may cover the light emitting elements EDs and the bank layer BNL not illustrated in the drawings. The first insulating material layer PIL1 may be partially patterned in a process to be described later to form the first insulating layer PAS1 disposed on the light emitting element ED.

Figure 12:
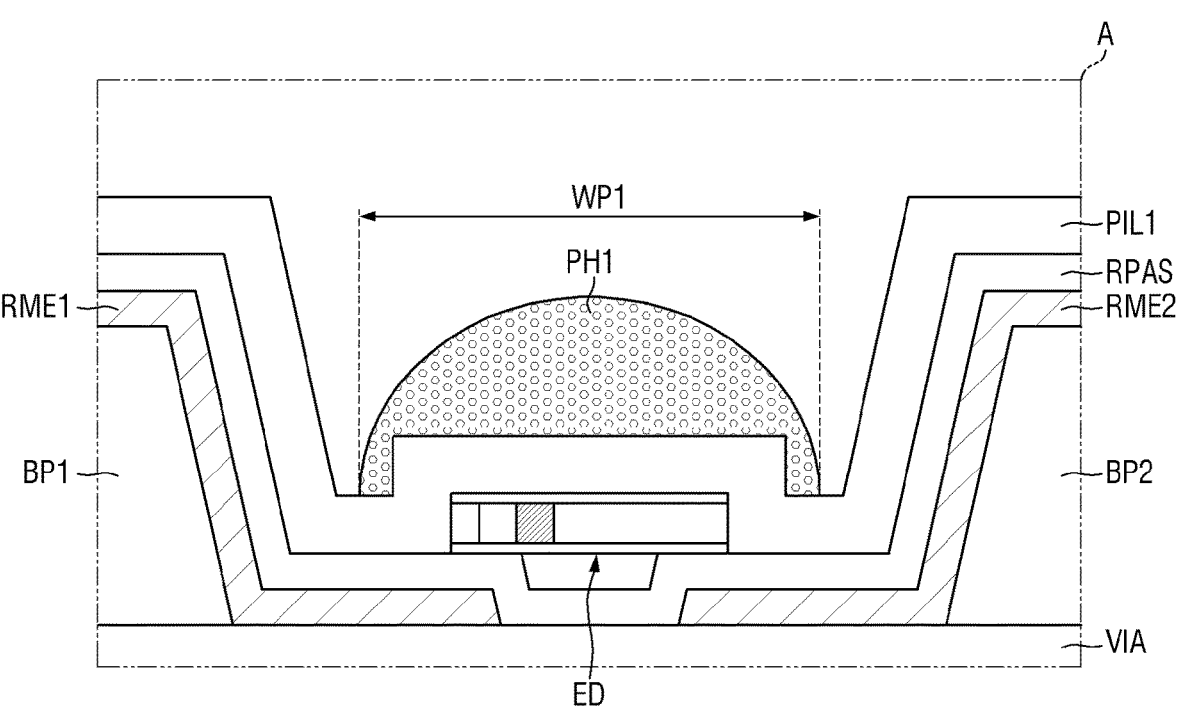

Subsequently, referring to FIGS. 12 to 14, a process of forming a first photoresist pattern PH1 on the first insulating material layer PILL etching the first insulating material layer PIL1 (first etching), and ashing the first photoresist pattern PH1 (first ashing) is performed.

The first photoresist pattern PH1 may be used as a mask in the process of patterning the first insulating material layer PILL The patterning process of the first insulating material layer PIL1 may be performed in a manner that may be employed in the pertinent art. For example, the first photoresist pattern PH1 may be formed by applying a photosensitive material layer on the first insulating material layer PIL1 and exposing and developing it, and the first insulating material layer PIL1 may be partially etched along the first photoresist pattern PH1. The process of etching the first insulating material layer PIL1 may be carried out as a dry etching process or a wet etching process.

The first photoresist pattern PH1 may be disposed between the first barrier wall BP1 and the second barrier wall BP2 to cover the light emitting element ED. The first photoresist pattern PH1 may be formed to have a width WP1 larger than the length of the light emitting element ED, and may be disposed to cover the light emitting elements ED disposed between the barrier walls BP1 and BP2. As the first photoresist pattern PH1 is formed to have the width WP1 larger than the length of the light emitting element ED and the first insulating material layer PIL1 is etched through the two or more etching processes, both ends of each of the light emitting elements ED may be exposed even if the position of the first photoresist pattern PH1 is deviated from the design value.

Figure 13:
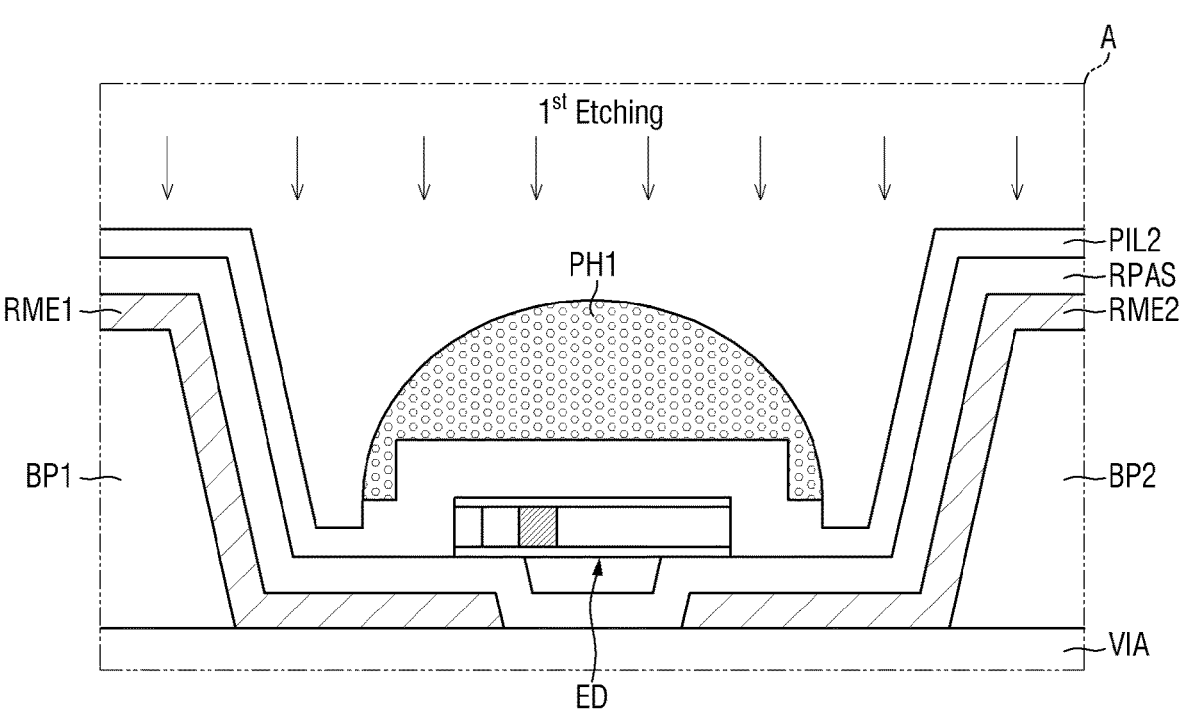
Figure 14:
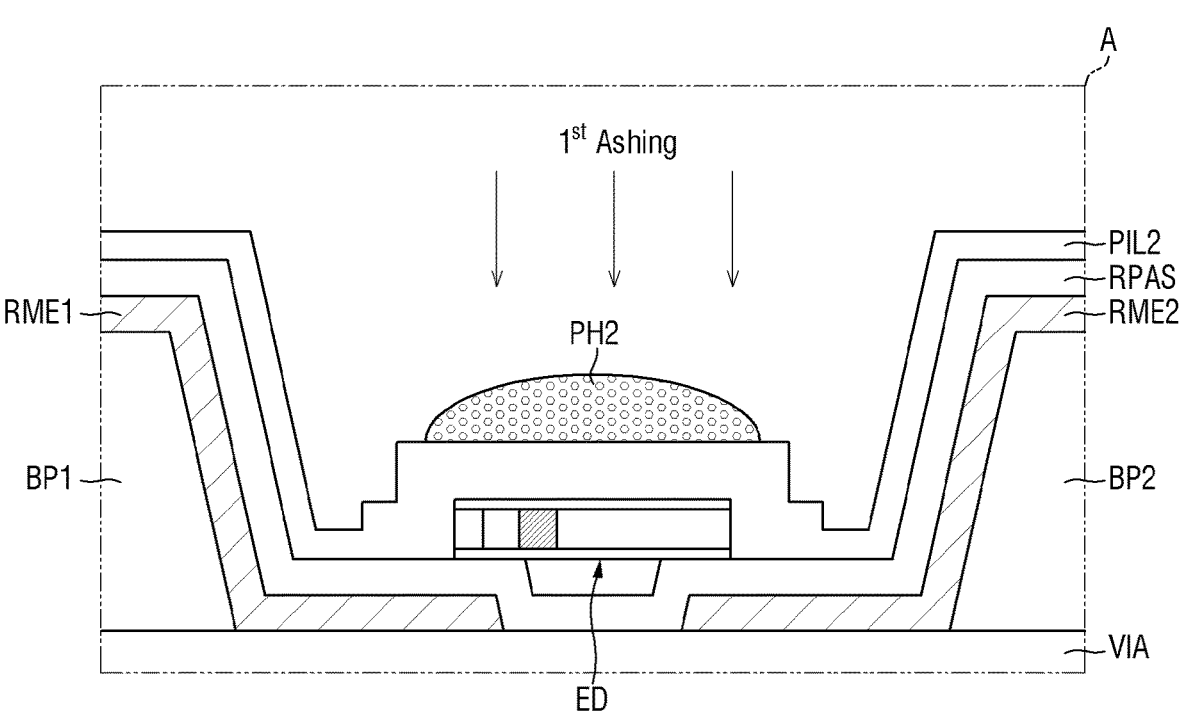

As illustrated in FIGS. 13 and 14, the first etching in which a portion of the first insulating material layer PIL1 on which the first photoresist pattern PH1 is not disposed is partially etched and the first ashing in which a part of the first photoresist pattern PH1 is removed are performed. In one embodiment, each of the first etching and the first ashing may be performed as a dry etching process.

As the portion of the first insulating material layer PIL1 on which the first photoresist pattern PH1 is not disposed is not completely removed but only the thickness thereof decreases, a second insulating material layer PIL2 may be formed. As the portion of the first photoresist pattern PH1 is removed and the width thereof is reduced, a second photoresist pattern PH2 may be formed. Although it is illustrated in the drawings that the first etching and the first ashing are performed as separate etching processes, the disclosure is not limited thereto. The first etching and the first ashing may be performed as a substantially continuous process or performed simultaneously, and the first insulating material layer PIL1 and the first photoresist pattern PH1 may be partially removed in substantially one and the same etching process.

The second insulating material layer PIL2 formed by performing the first etching process (the first etching and the first ashing) may include portions with different thicknesses depending on positions. A thin portion of the second insulating material layer PIL2 may be a portion in which the first photoresist pattern PH1 is not disposed. The second photoresist pattern PH2 is disposed on the second insulating material layer PIL2 and may be positioned to overlap the light emitting element ED. In a subsequent etching process, a portion of the second insulating material layer PIL2 on which the second photoresist pattern PH2 is not disposed may be removed, and the size of the second photoresist pattern PH2 may be further reduced.

Figure 15:
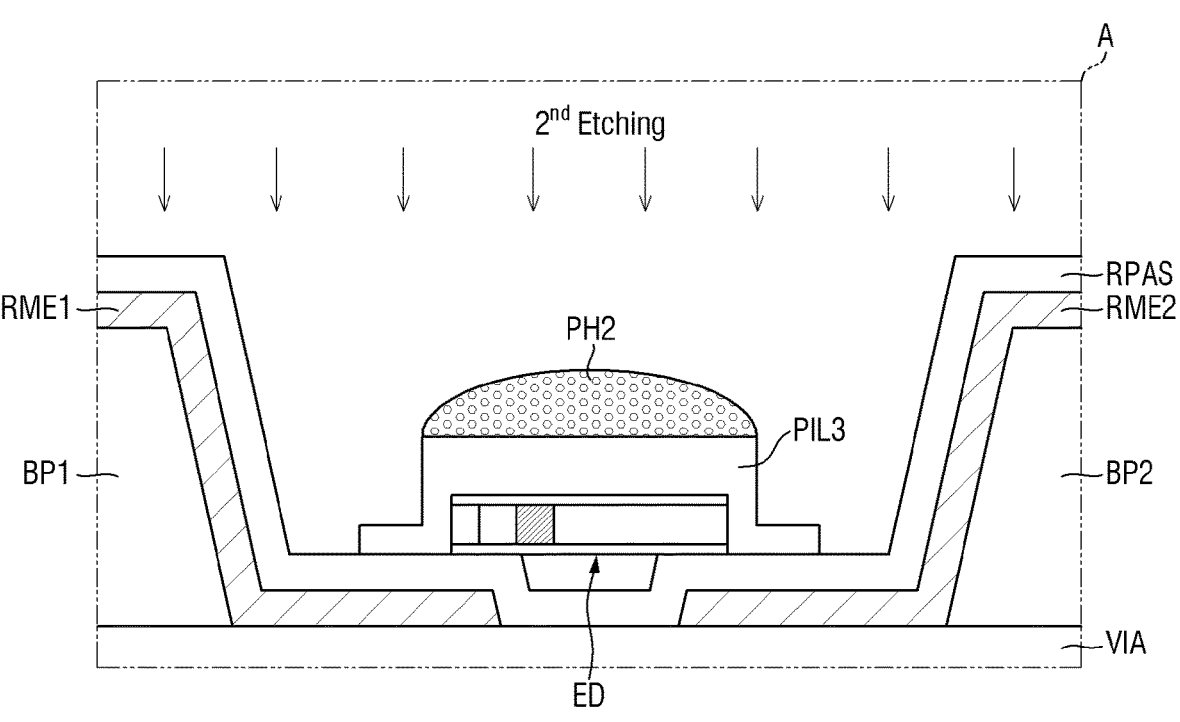
Figure 16:
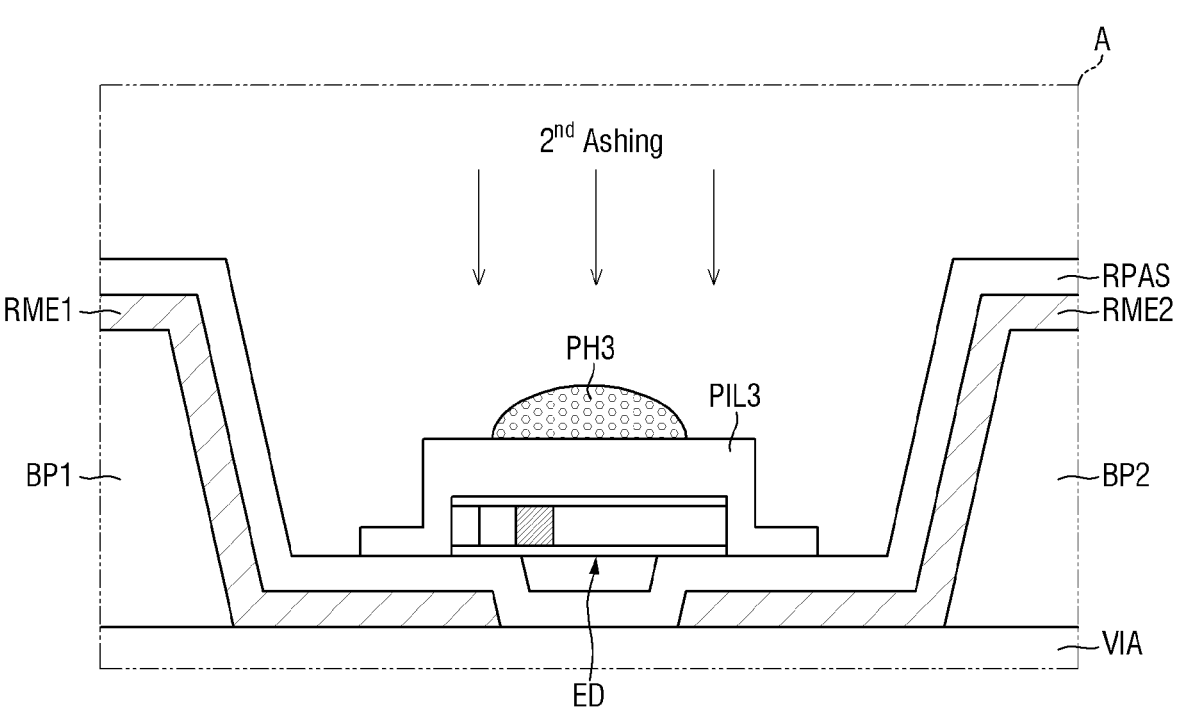

Referring to FIGS. 15 and 16, a process of etching the second insulating material layer PIL2 along the second photoresist pattern PH2 (second etching) and ashing the second photoresist pattern PH2 (second ashing) is performed. In the process, the second etching in which a portion of the second insulating material layer PIL2 on which the second photoresist pattern PH2 is not disposed is partially etched and the second ashing in which a part of the second photoresist pattern PH2 is removed are performed. Similar to the above description, the second etching and the second ashing may be performed continuously or simultaneously.

A part of the portion of the second insulating material layer PIL2 on which the second photoresist pattern PH2 is not disposed is removed, whereas another part thereof is not completely removed but the thickness thereof decreases. As a result, a third insulating material layer PIL3 may be formed. As the second photoresist pattern PH2 is partially removed to have a reduced width, a third photoresist pattern PH3 may be formed.

The third insulating material layer PIL3 formed by performing the second etching process (the second etching and the second ashing) may include a part with a different thickness depending on the position. A thin portion of the third insulating material layer PIL3 may be a portion on which the second photoresist pattern PH2 is not disposed. The third photoresist pattern PH3 is disposed on the third insulating material layer PIL3 and may be positioned to overlap the light emitting element ED. In a subsequent etching process, the portion of the third insulating material layer PIL3 on which the third photoresist pattern PH3 is not disposed may be removed, and the third photoresist pattern PH3 may be given a smaller size. As the insulating material layers PILL PIL2 and PIL3 are gradually etched while sequentially reducing the sizes of the photoresist patterns PH1, PH2 and PH3, the insulating material layers PILL PIL2 and PIL3 may have a shape including portions with different thicknesses. The insulating material layers PILL PIL2 and PH3 may be etched until both ends of the light emitting elements ED are exposed regardless of the positions of the photoresist patterns PH1, PH2, and PH3.

Figure 17:
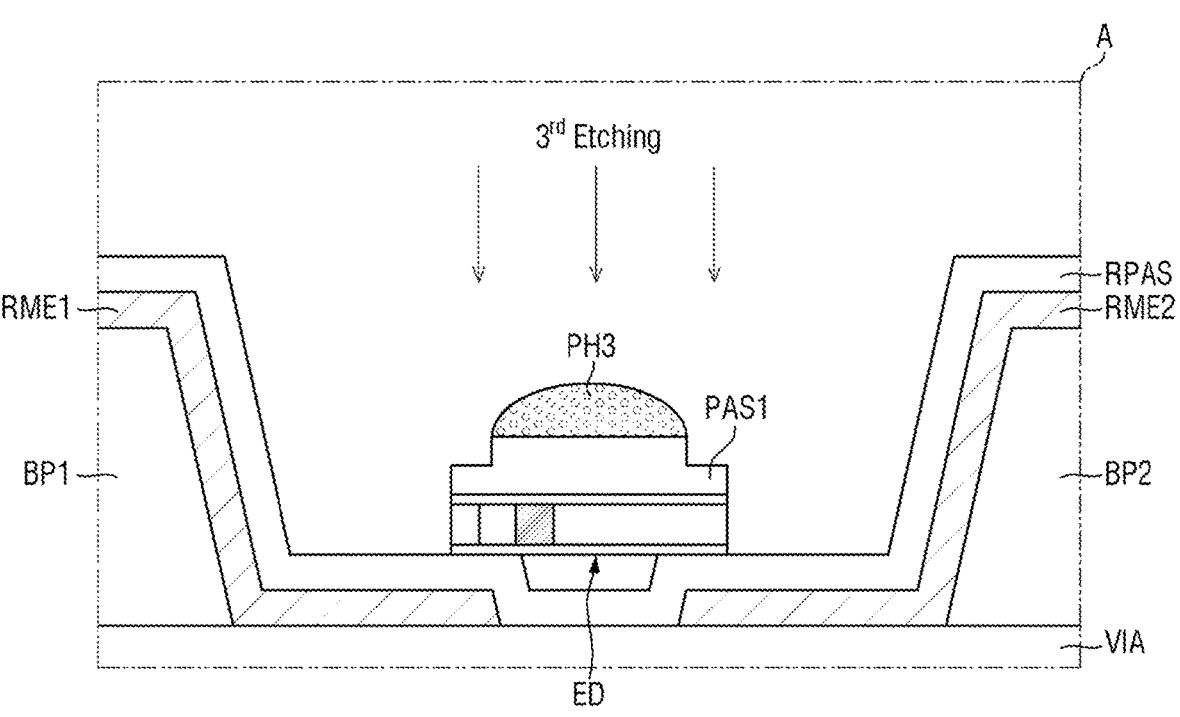
Figure 18:
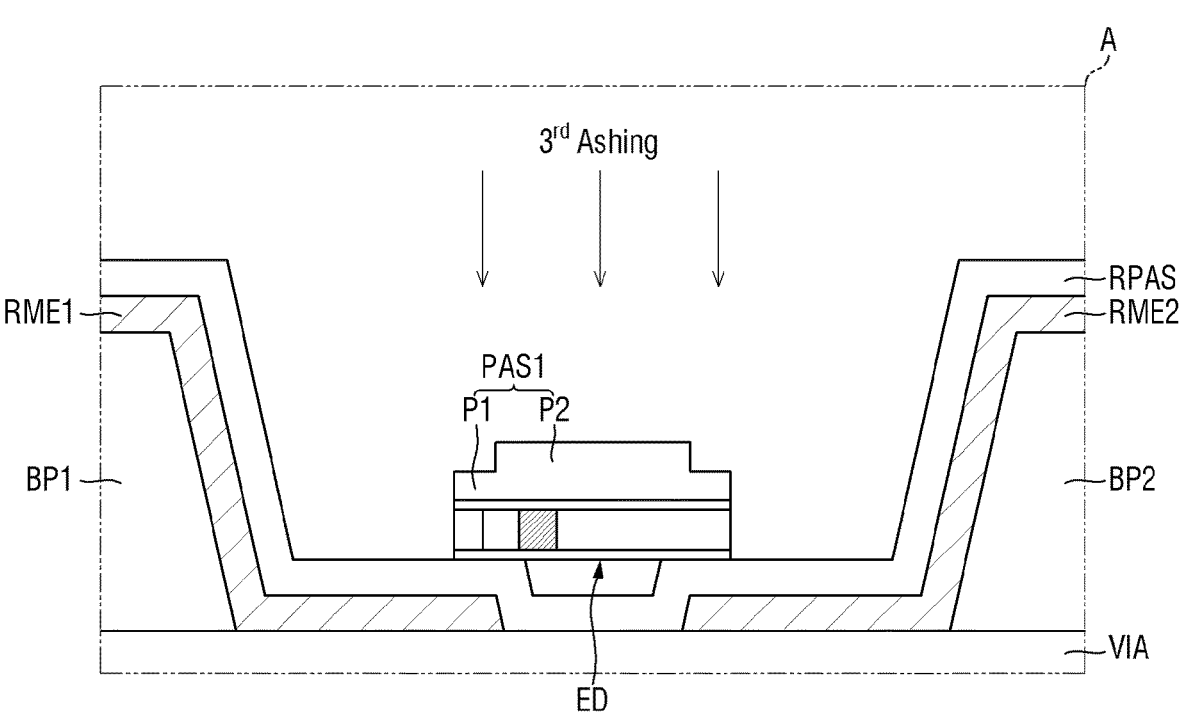

Subsequently, referring to FIGS. 17 and 18, a process of etching the third insulating material layer PIL3 along the third photoresist pattern PH3 (third etching) and ashing the third photoresist pattern PH3 (third ashing) is performed. In this process, the third etching in which a portion of the third insulating material layer PIL3 on which the third photoresist pattern PH3 is not disposed is partially etched and the third ashing in which the third photoresist pattern PH3 is removed are performed. Similar to the above description, the third etching and the third ashing may be performed continuously or simultaneously.

A part of the portion of the third insulating material layer PIL3 on which the third photoresist pattern PH3 is not disposed may be removed, and another part thereof may not be completely removed but the thickness thereof may be reduced. As the third insulating material layer PIL3 is patterned, both ends of the light emitting elements ED may be exposed, and the first insulating layer PAS1 may be formed on the light emitting element ED. If both ends of the light emitting elements ED are exposed, an additional etching process may not be performed, and the third photoresist pattern PH3 may be completely removed.

The first insulating layer PAS1 formed by performing the third etching process (the third etching and the third ashing) may include portions P1 and P2 having different thicknesses depending on positions. The first portion P1 of the first insulating layer PAS1, which has a small thickness, may be a portion on which the third photoresist pattern PH3 is not disposed, and the second portion P2 having a large thickness may be a portion on which the third photoresist pattern PH3 is disposed.

Subsequently, although not shown in the drawings, the display device 10 may be fabricated by forming the connection electrodes CNE (CNE1 and CNE2) respectively in contact with the side surfaces of both exposed ends of the light emitting element ED.

As illustrated in FIGS. 10 to 18, the first insulating material layer PIL1 disposed to cover the light emitting element ED may be gradually etched through etching processes, and it is possible to etch the first insulating layer PIL1 until both side surfaces of the light emitting elements ED are exposed regardless of the positions of the photoresist patterns PH1, PH2, and PH3. As the first insulating layer PAS1 is formed through the above-described processes, the first insulating layer PAS1 may be formed so as not to cover both ends of the light emitting elements ED even if there is an error in alignment with the light emitting elements ED in the process of forming the photoresist patterns PH1, PH2, and PH3. The display device 10 may include the first insulating layer PAS1 formed through the stepwise etching process, and a connection failure between the light emitting element ED and the connection electrode CNE may be prevented.

Hereinafter, various embodiments of the display device 10 will be described with reference to other drawings.

Figure 19:
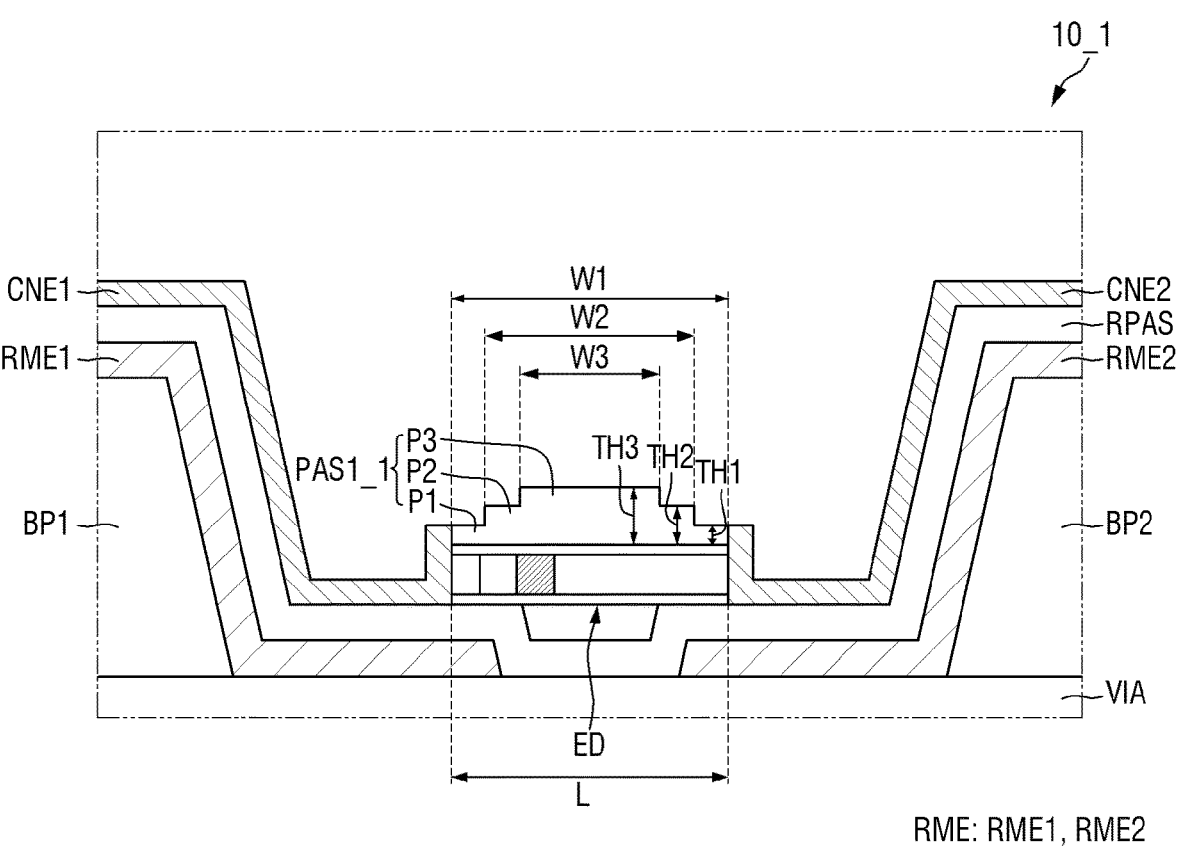
FIG. 19 is a schematic cross-sectional view illustrating a portion of a display device according to an embodiment.

FIG. 19 is a schematic cross-sectional view illustrating a portion of a display device according to an embodiment.

Referring to FIG. 19, a first insulating layer PAS1_1 of a display device 10_1 according to one embodiment may include a first portion P1, a second portion P2, and a third portion P3 having different thicknesses. In the first insulating layer PAS1_1, the third portion P3 having the largest thickness TH3 may be disposed at the center thereof, and the second portion P2 and the first portion P1 having smaller thicknesses may be disposed in sequence as it goes outwards. A thickness TH2 of the second portion P2 may be smaller than a thickness TH3 of the third portion P3, but may be larger than a thickness TH1 of the first portion P1. A width W1 of the first insulating layer PAS1_1 may be equal to or less than the length L of the light emitting element ED, and a width W3 of the third portion P3 of the first insulating layer PAS1_1 may be smaller than the width W1 of the first insulating layer PAS1_1. A distance W2 between the second portions P2 positioned at both sides of the third portion P3 may be larger than the width W3 of the third portion P3 and less than the width W1 of the first insulating layer PAS1_1.

In the embodiment, the process of forming the first insulating layer PAS1_1 may include a larger number of etching processes. The first insulating layer PAS1_1 may further include portions having different thicknesses depending on positions, and may have a gradually stepped shape.

Figure 20:
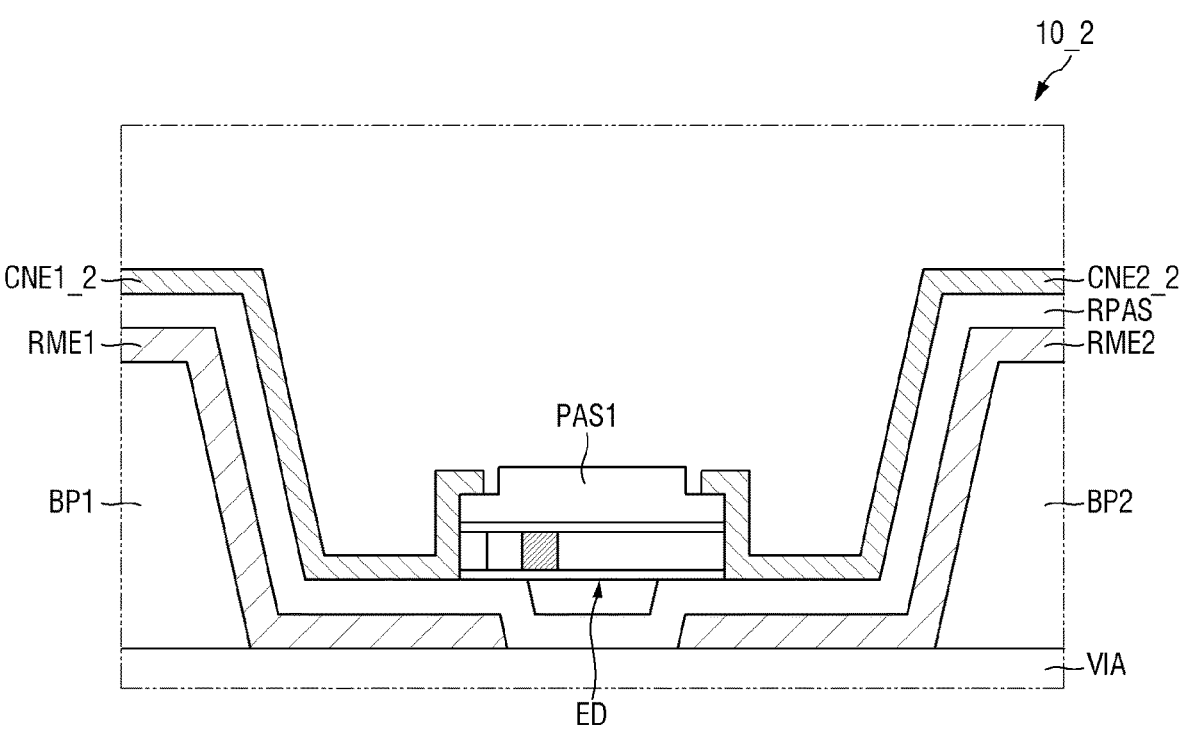
FIG. 20 is a schematic cross-sectional view illustrating a portion of a display device according to an embodiment.

FIG. 20 is a schematic cross-sectional view illustrating a portion of a display device according to an embodiment.

Referring to FIG. 20, in a display device 10_2 according to one embodiment, a first connection electrode CNE1_2 and a second connection electrode CNE2_2 may be partially disposed on the first insulating layer PAS1. In an embodiment in which the second portion P2 of the first insulating layer PAS1 is disposed at the center of the first insulating layer PAS1 and the first portions P1 are disposed at both sides thereof, the first connection electrode CNE1_2 and the second connection electrode CNE2_2 may be disposed on the first portion P1 of the first insulating layer PAS1. The first connection electrode CNE1_2 may be in contact with the side surface of the first end of the light emitting element ED and the first side surface and the first top surface of the first portion P1 of the first insulating layer PAS1. The second connection electrode CNE2_2 may be in contact with the side surface of the second end of the light emitting element ED and the second side surface and the second top surface of the first portion P1 of the first insulating layer PAS1. The first side surface of the first insulating layer PAS1 may be parallel to the side surface of the first end of the light emitting element ED, and the second side surface of the first insulating layer PAS1 may be parallel to the side surface of the second end of the light emitting element ED.

The distance between the connection electrodes CNE_2 may be smaller than the width of the first insulating layer PAS1, and as a part thereof is disposed on the first insulating layer PAS1, a sufficient contact area in contact with both side surfaces of the light emitting element ED may be obtained. The distance between the connection electrodes CNE_2 may be larger than the width of the second portion P2 of the first insulating layer PAS1, and each of the connection electrodes CNE_2 may be spaced apart from the second portion P2 of the first insulating layer PAS1. However, the disclosure is not limited thereto, and the connection electrodes CNE_2 may be in contact with the second portion P2 of the first insulating layer PAS1.

Furthermore, as will be described later, in an embodiment in which the second portion P2 of the first insulating layer PAS1 is not disposed at the center of the first insulating layer PAS1 but is biased to one side or a side, the first connection electrode CNE1_2 may be in contact with the top surface of the first portion P1, and the second connection portion CNE2_2 may be in contact with the top surface of the second portion P2.

Figure 21:
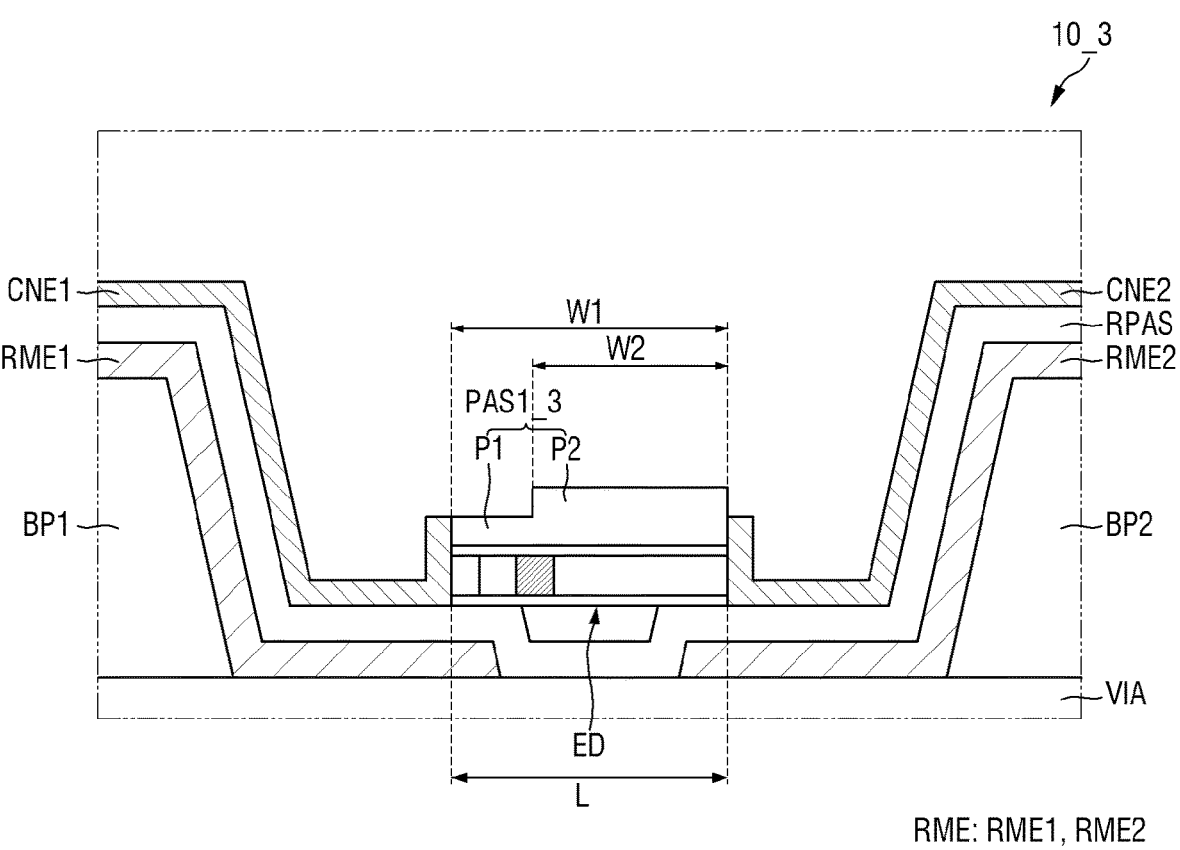
FIG. 21 is a schematic cross-sectional view illustrating a portion of a display device according to an embodiment.

FIG. 21 is a schematic cross-sectional view illustrating a portion of a display device according to an embodiment.

Referring to FIG. 21, in a display device 10_3 according to one embodiment, a second portion P2 of a first insulating layer PAS1_3 may not be disposed at the center of the first insulating layer PAS1_3. A first portion P1 may be disposed at one side or a side of the first insulating layer PAS1_3, and a second portion P2 may be disposed at the other side opposite thereto. Accordingly, the first connection electrode CNE1 may be in contact with the first portion P1, and the second connection electrode CNE2 may be in contact with the second portion P2.

The first insulating layer PAS1_3 may be disposed such that both ends of the light emitting element ED are exposed regardless of the position where the first photoresist pattern PH1 is formed. In the embodiments of FIGS. 10 to 18, the first photoresist pattern PH1 may be formed to overlap the light emitting element ED with their centers aligned to each other, and the first insulating layer PAS1 formed by patterning the first insulating material layer PIL1 have the second portion P2 at the center thereof. If the first photoresist pattern PH1 is formed to be biased to one side or a side without being aligned with the light emitting element ED, the first insulating layer PAS1_3 may be formed so that both ends of the light emitting element ED are exposed, but the second portion P2 may not be disposed at the center of the first insulating layer PAS1_3. However, in the display device 10_3, both ends of the light emitting element ED may be in contact with the connection electrode CNE smoothly regardless of the shape of the first insulating layer PAS1_3. For example, the display device 10_3 may not suffer a contact failure between the light emitting element ED and the connection electrode CNE even if the position where the first photoresist pattern PH1 is formed is different from a design value in the process of forming the first insulating layer PAS1_3.

Figure 22:
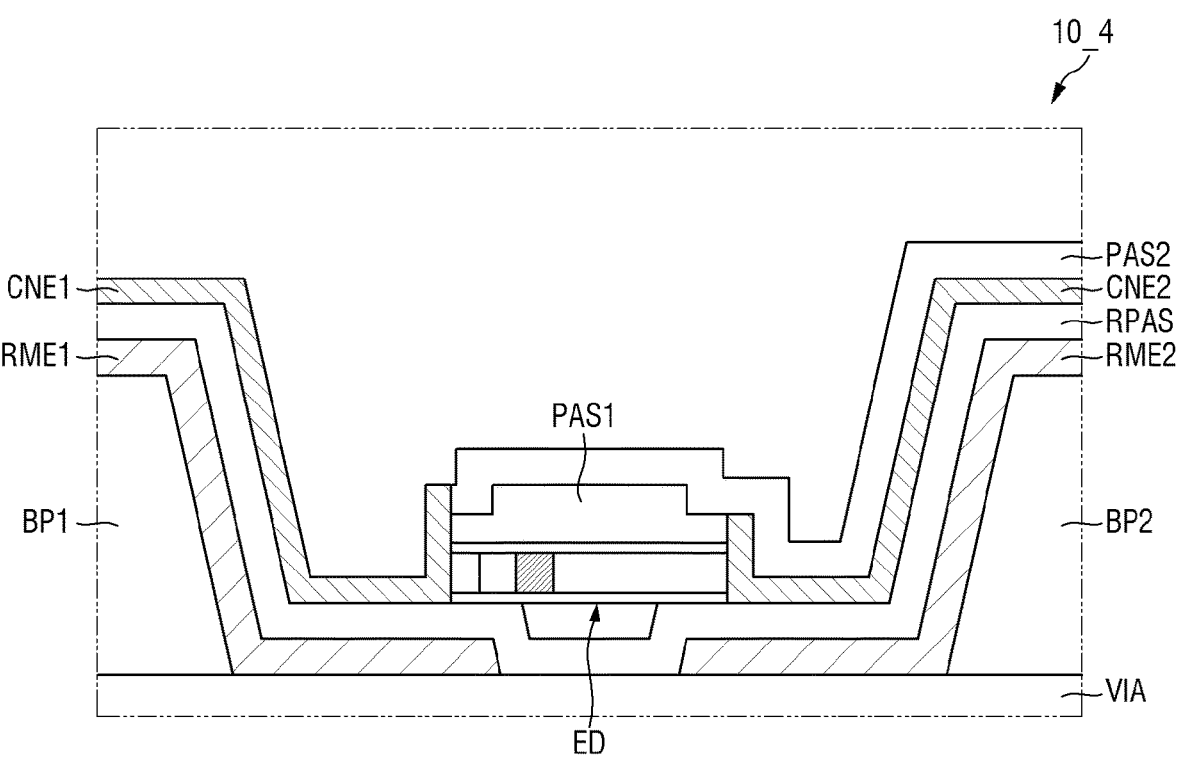
FIGS. 22 and 23 are schematic cross-sectional views illustrating a portion of a display device according to an embodiment.
Figure 23:
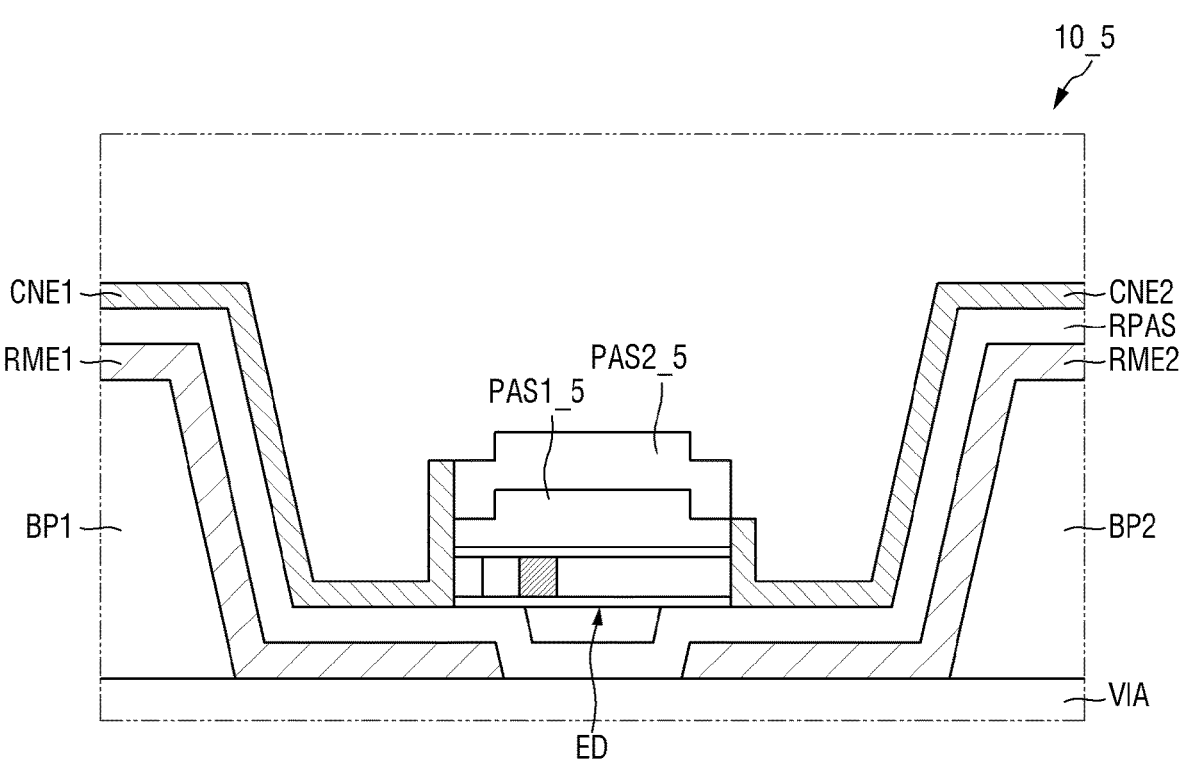

FIGS. 22 and 23 are schematic cross-sectional views illustrating a portion of a display device according to an embodiment.

Referring to FIGS. 22 and 23, the display devices 10_4, 10_5 in accordance with an embodiment may further include a second insulating layer PAS2 positioned on the first insulating layer PAS1. In a display device 10_4 of FIG. 22, the second insulating layer PAS2 may be disposed to cover the first insulating layer PAS1 and the second connection electrode CNE2. In a display device 10_5 of FIG. 23, a second insulating layer PAS2_5 may be disposed only on a first insulating layer PAS1_5.

The second insulating layer PAS2 may be disposed to cover at least the first insulating layer PAS1, and may be formed between the process of forming the first connection electrode CNE1 and the process of forming the second connection electrode CNE2. For example, the second insulating layer PAS2 may be formed after the process of forming the second connection electrode CNE2, and the first connection electrode CNE1 may be formed after the second insulating layer PAS2 is formed. The second insulating layer PAS2 may insulate the first connection electrode CNE1 and the second connection electrode CNE2 to prevent direct contact therebetween. Accordingly, the first connection electrode CNE1 and the second connection electrode CNE2 may be prevented from coming into direct contact with each other, resulting in a short circuit.

In an embodiment of FIG. 22, the second insulating layer PAS2 may be disposed to cover the first insulating layer PAS1 and the second connection electrode CNE2. The second connection electrode CNE2 may be in contact with the side surface of the second end of the light emitting element ED and the second side surface of the first insulating layer PAS1. The top surface of the second connection electrode CNE2 may be in contact with the bottom surface of the second insulating layer PAS2. The first connection electrode CNE1 may be in contact with the side surface of the first end of the light emitting element ED, the first side surface of the first insulating layer PAS1, and the side surface of the second insulating layer PAS2 parallel thereto. As the first connection electrode CNE1 is formed after the second insulating layer PAS2 is formed, the first connection electrode CNE1 may be in contact with the second insulating layer PAS2 as well. In the drawings, it is illustrated that the first connection electrode CNE1 is in contact with only the side surface of the second insulating layer PAS2. However, the disclosure is not limited thereto. The first connection electrode CNE1 may be disposed to be in contact with the top surface of the second insulating layer PAS2 as well.

In an embodiment of FIG. 23, the second insulating layer PAS2_5 may be disposed only on the first insulating layer PAS1_5. Like the first insulating layer PAS1_5, the second insulating layer PAS2_5 may be formed by etching an insulating material layer in stages through patterning processes, and may have a shape including portions having different thicknesses. The second connection electrode CNE2 may be in contact with the side surface of the second end of the light emitting element ED and the second side surface of the first insulating layer PAS1_5. The first connection electrode CNE1 may be in contact with the side surface of the first end of the light emitting element ED, the first side surface of the first insulating layer PAS1_5, and the side surface of the second insulating layer PAS2_5 parallel thereto. As the first connection electrode CNE1 is formed after the second insulating layer PAS2 is formed, the first connection electrode CNE1 may be in contact with the second insulating layer PAS2_5 as well.

Figure 24:
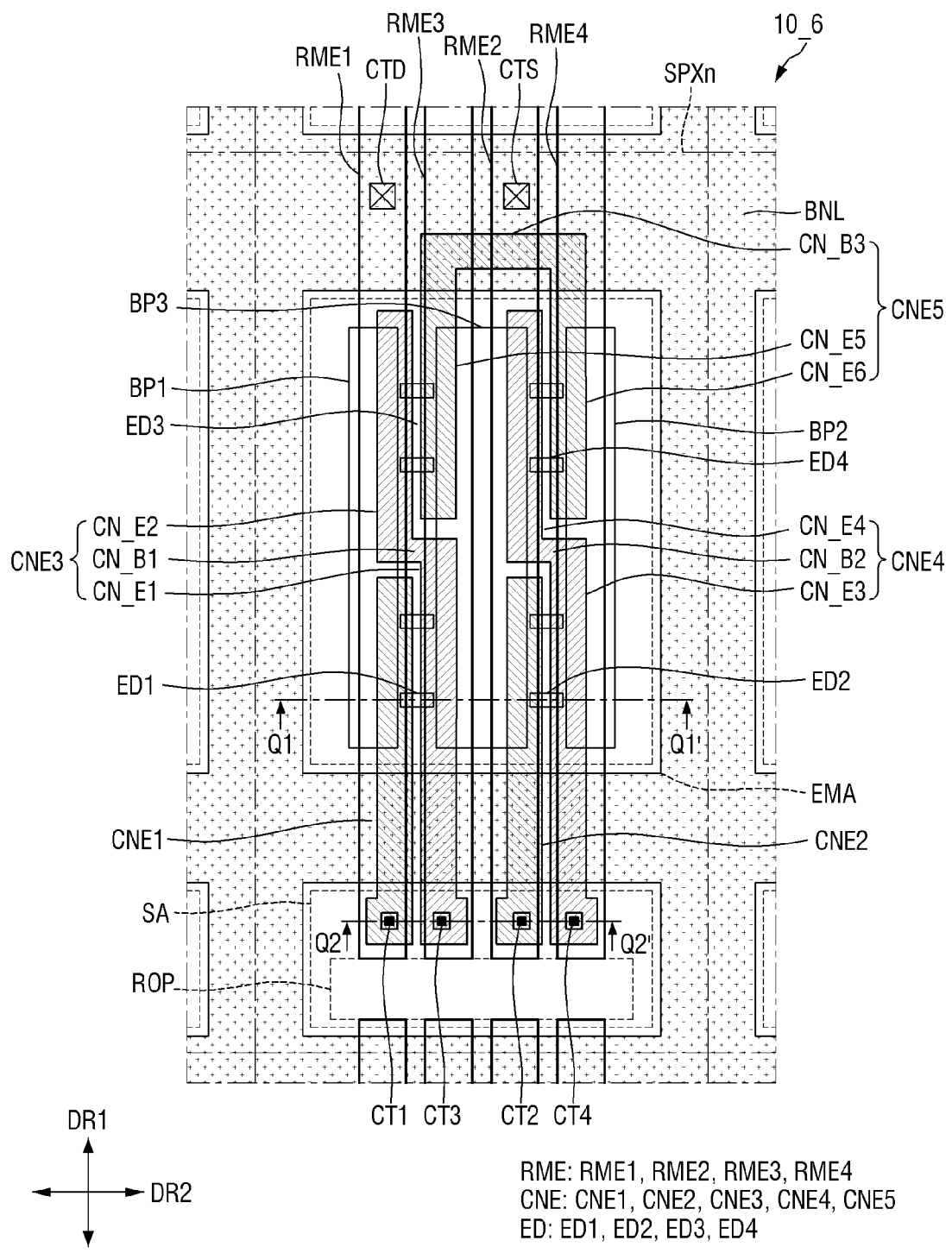
FIG. 24 is a schematic plan view illustrating a sub-pixel of a display device according to an embodiment.
Figure 25:
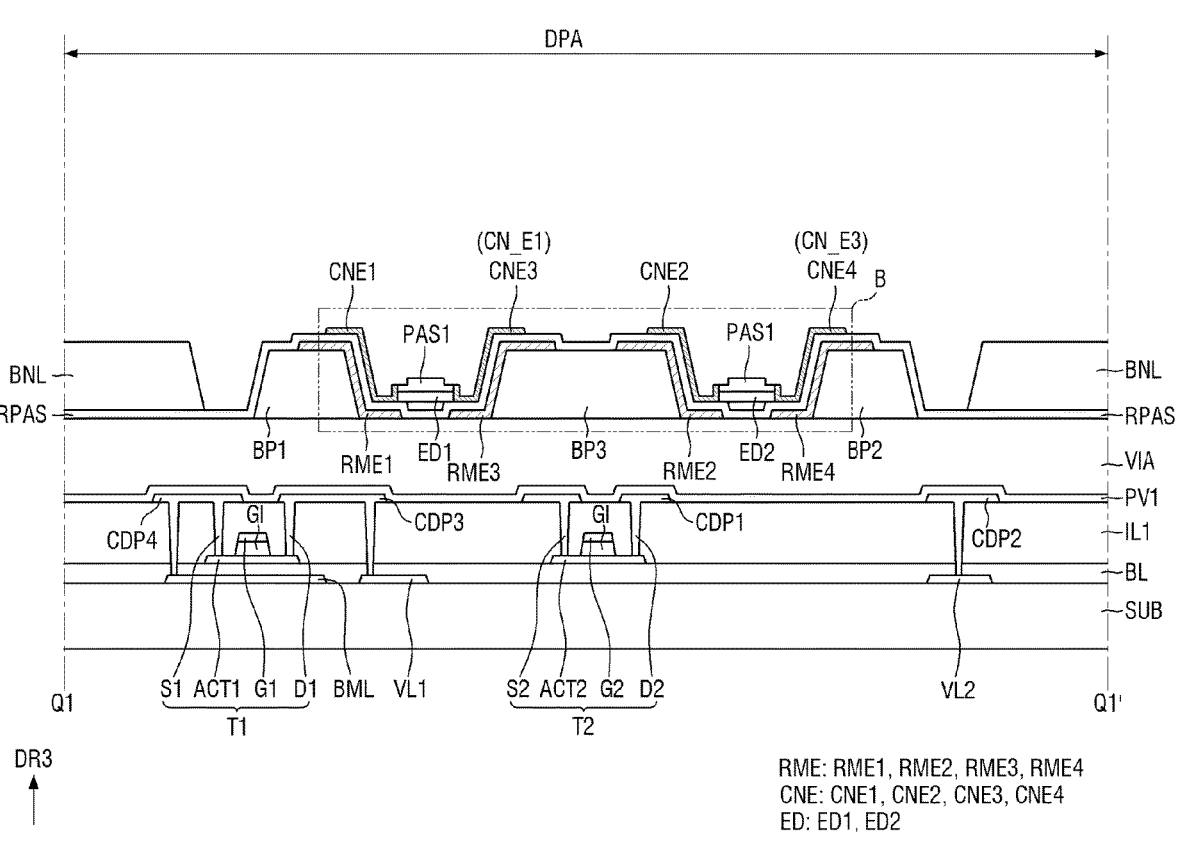
FIG. 25 is a c schematic ross-sectional view taken along line Q1-Q1' of FIG. 24.
Figure 26:
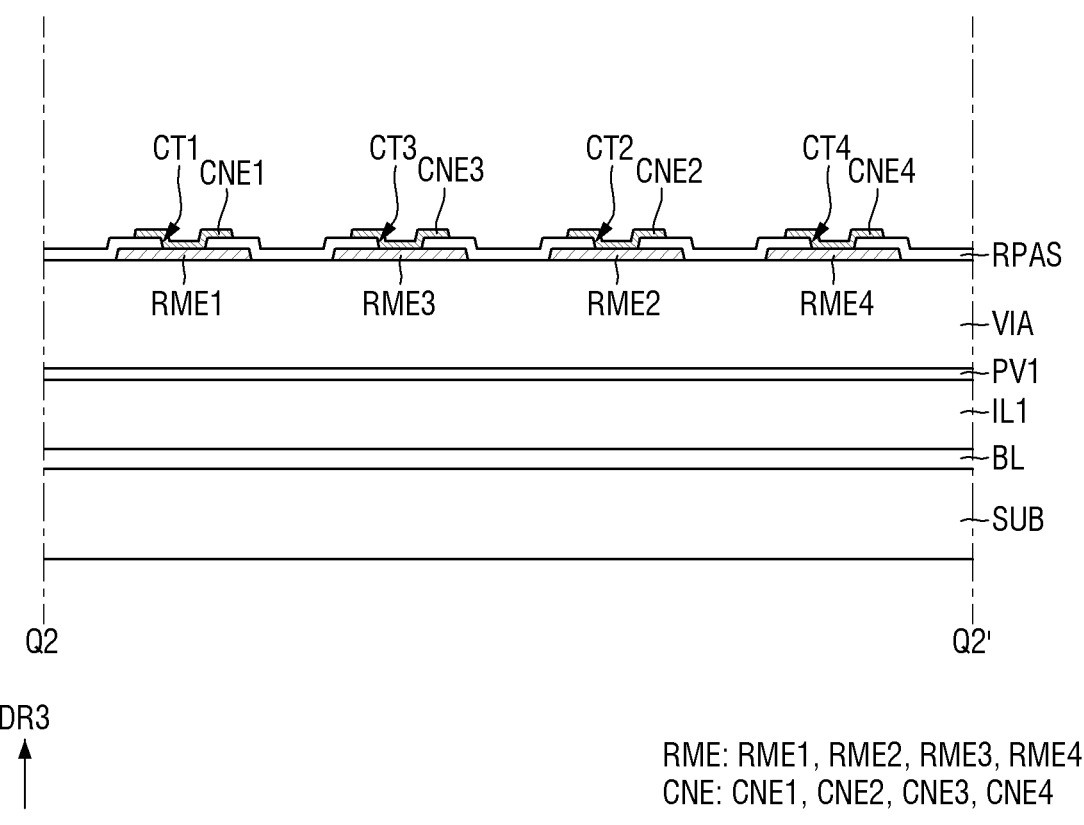
FIG. 26 is a schematic cross-sectional view taken along line Q2-Q2' of FIG. 24.

FIG. 24 is a schematic plan view illustrating a sub-pixel of a display device according to an embodiment. FIG. 25 is a schematic cross-sectional view taken along line Q1-Q1' of FIG. 24. FIG. 26 is a schematic cross-sectional view taken along line Q2-Q2' of FIG. 24.

FIG. 24 illustrates planar arrangement of electrodes RME (RME1, RME2, RME3, and RME4), barrier walls BP1, BP2, and BP3, the bank layer BNL, the light emitting elements ED, connection electrodes CNE (CNE1, CNE2, CNE3, CNE4, and CNE5) disposed in one pixel PX of a display device 10_6. FIG. 25 illustrates a cross section across both ends of the light emitting elements ED (ED1, ED2, ED3, and ED4) disposed on different electrodes RME, and FIG. 26 illustrates a cross section across contact portions CT1, CT2, CT3, and CT4.

Referring to FIGS. 24 to 26, the display device 10_6 according to the embodiment may include a larger number of electrodes RME (RME1, RME2, RME3, and RME4), a larger number of barrier walls BP1, BP2, and BP3, a larger number of light emitting elements ED (ED1, ED2, ED3, and ED4), and a larger number of connection electrodes CNE (CNE1, CNE2, CNE3, CNE4, and CNE5). The display device 10_6 according to an embodiment may be different from an embodiment of FIG. 5 in that a larger number of electrodes and a larger number of light emitting elements are included in each sub-pixel SPXn. In the following description, redundant description will be omitted while focusing on differences.

The barrier walls BP1, BP2, and BP3 may further include a third barrier wall BP3 disposed between the first barrier wall BP1 and the second barrier wall BP2. The first barrier wall BP1 may be located on the left side with respect to the center of the emission area EMA, the second barrier wall BP2 may be located on the right side with respect to the center of the emission area EMA, and the third barrier wall BP3 may be located at the center of the emission area EMA. The width of the third barrier wall BP3 measured in the second direction DR2 may be greater than those of the first barrier wall BP1 and the second barrier wall BP2 measured in the second direction DR2. The gap between the barrier walls BP1, BP2, and BP3 in the second direction DR2 may be greater than the gap between the electrodes RME. The first barrier wall BP1 may be disposed to partially overlap the first electrode RME1, and the second barrier wall BP2 may be disposed to partially overlap the fourth electrode RME4. The third barrier wall BP3 may be disposed to partially overlap the second electrode RME2 and the third electrode RME3. At least parts of the electrodes RME may be arranged without overlapping the barrier walls BP1, BP2, and BP3.

The electrodes RME arranged for each sub-pixel SPXn may further include a third electrode RME3 and a fourth electrode RME4 in addition to a first electrode RME1 and a second electrode RME2.

The third electrode RME3 may be disposed between the first electrode RME1 and the second electrode RME2, and the fourth electrode RME4 may be spaced apart from the third electrode RME3 in the second direction DR2 with the second electrode RME2 interposed therebetween. The electrodes RME may be sequentially arranged in the order of the first electrode RME1, the third electrode RME3, the second electrode RME2, and the fourth electrode RME4 from the left side to the right side of the sub-pixel SPXn. The electrodes RME may face and be spaced apart from each other in the second direction DR2. The electrodes RME may be spaced apart from the electrodes RME of another sub-pixel SPXn adjacent in the first direction DR1 at the separation portion ROP of the sub-region SA.

Among the electrodes RME, the first electrode RME1 and the second electrode RME2 may be in contact with the first conductive pattern CDP1 and the second voltage line VL2 disposed thereunder through the electrode contact holes CTD and CTS disposed under or below the bank layer BNL, respectively, whereas the third electrode RME3 and the fourth electrode RME4 may not be in contact with them.

The lower insulating layer RPAS may be disposed in a structure similar to that in the above-described embodiments. The lower insulating layer RPAS may be disposed in the entire display area DPA and may cover the electrodes RME and the barrier walls BP1, BP2, and BP3.

The light emitting elements ED may be arranged between the barrier walls BP1, BP2, and BP3 or on different electrodes RME. Some or a number of the light emitting elements ED may be arranged between the first barrier wall BP1 and the third barrier wall BP3, and some or a number of other light emitting elements ED may be arranged between the third barrier wall BP3 and the second barrier wall BP2. In accordance with one embodiment, the light emitting element ED may include a first light emitting element ED1 and a third light emitting element ED3 arranged between the first barrier wall BP1 and the third barrier wall BP3, and a second light emitting element ED2 and a fourth light emitting element ED4 arranged between the third barrier wall BP3 and the second barrier wall BP2. Each of the first light emitting element ED1 and the third light emitting element ED3 may be disposed above the first electrode RME1 and the third electrode RME3, and each of the second light emitting element ED2 and the fourth light emitting element ED4 may be disposed above the second electrode RME2 and the fourth electrode RME4. The first light emitting element ED1 and the second light emitting element ED2 may be arranged adjacent to the lower side of the emission area EMA of the corresponding sub-pixel SPXn or adjacent to the sub-region SA, and the third light emitting element ED3 and the fourth light emitting element ED4 may be arranged adjacent to the upper side of the emission area EMA of the corresponding sub-pixel SPXn.

However, the light emitting elements ED may not be classified according to the arrangement position in the emission area EMA, but may be classified according to a connection relationship with the connection electrode CNE, which will be described later. Both ends of each light emitting element ED may be in contact with different connection electrodes CNE according to an arrangement method of the connection electrodes CNE. The light emitting elements ED may be classified into different types of light emitting elements ED according to the type of the connection electrode CNE in contact therewith.

The connection electrodes CNE may further include, in addition to the first connection electrode CNE1 disposed on the first electrode RME1, the second connection electrode CNE2 disposed on the second electrode RME2, a third connection electrode CNE3, a fourth connection electrode CNE4, and a fifth connection electrode CNE5 arranged across the electrodes RME.

Each of the first connection electrode CNE1 and the second connection electrode CNE2 may have a length extending in the first direction DR1 that is shorter than those of other connection electrodes CNE. The first connection electrode CNE1 and the second connection electrode CNE2 may be arranged on the lower side with respect to the center of the emission area EMA. The first connection electrode CNE1 and the second connection electrode CNE2 may be disposed across the emission area EMA and the sub-region SA of the corresponding sub-pixel SPXn, and may be in direct contact with the electrode RME through the contact portions CT1 and CT2 formed in the sub-region SA, respectively. The first connection electrode CNE1 may be in direct contact with the first electrode RME1 through the first contact portion CT1 penetrating the lower insulating layer RPAS in the sub-region SA, and the second connection electrode CNE2 may be in direct contact with the second electrode RME2 through the second contact portion CT2 penetrating the lower insulating layer RPAS in the sub-region SA.

The third connection electrode CNE3 may include a first extension portion CN_E1 disposed on the third electrode RME3, a second extension portion CN_E2 disposed on the first electrode RME1, and a first connection portion CN_B1 that connects the first extension portion CN_E1 to the second extension portion CN_E2. The first extension portion CN_E1 may be spaced apart from the first connection electrode CNE1 in the second direction DR2, and the second extension portion CN_E2 may be spaced apart from the first connection electrode CNE1 in the first direction DR1. The first extension portion CN_E1 may be disposed on the lower side of the emission area EMA of the corresponding sub-pixel SPXn, and the second extension portion CN_E2 may be disposed on the upper side of the emission area EMA. The first extension portion CN_E1 and the second extension portion CN_E2 may be disposed in the emission area EMA. The first connection portion CN_B1 may be disposed across the first electrode RME1 and the third electrode RME3 at the central portion of the emission area EMA. The third connection electrode CNE3 may have a shape substantially extending in the first direction DR1, and may have a shape that is bent in the second direction DR2 and extends in the first direction DR1 again.

The fourth connection electrode CNE4 may include a third extension portion CN_E3 disposed on the fourth electrode RME4, a fourth extension portion CN_E4 disposed on the second electrode RME2, and a second connection portion CN_B2 that connects the third extension portion CN_E3 to the fourth extension portion CN_E4. The third extension portion CN_E3 may face and be spaced apart from the second connection electrode CNE2 in the second direction DR2, and the fourth extension portion CN_E4 may be spaced apart from the second connection electrode CNE2 in the first direction DR1. The third extension portion CN_E3 may be disposed on the lower side of the emission area EMA of the corresponding sub-pixel SPXn, and the fourth extension portion CN_E4 may be disposed on the upper side of the emission area EMA. The third extension portion CN_E3 and the fourth extension portion CN_E4 may be disposed in the emission area EMA. The second connection portion CN_B2 may be disposed across the second electrode RME2 and the fourth electrode RME4 while being adjacent to the center of the emission area EMA. The fourth connection electrode CNE4 may have a shape substantially extending in the first direction DR1, and may have a shape that is bent in the second direction DR2 and extends in the first direction DR1 again.

The fifth connection electrode CNE5 may include a fifth extension portion CN_E5 disposed on the third electrode RME3, a sixth extension portion CN_E6 disposed on the fourth electrode RME4, and a third connection portion CN_B3 that connects the fifth extension portion CN_E5 to the sixth extension portion CN_E6. The fifth extension portion CN_E5 may face and be spaced apart from the second extension portion CN_E2 of the third connection electrode CNE3 in the second direction DR2, and the sixth extension portion CN_E6 may face and be spaced apart from the fourth extension portion CN_E4 of the fourth connection electrode CNE4 in the second direction DR2. Each of the fifth extension portion CN_E5 and the sixth extension portion CN_E6 may be arranged on the upper side of the emission area EMA, and the third connection portion CN_B3 may be disposed across the third electrode RME3, the second electrode RME2, and the fourth electrode RME4. The fifth connection electrode CNE5 may be disposed to surround the fourth extension portion CN_E4 of the fourth connection electrode CNE4 in a plan view.

The third connection electrode CNE3 may be in contact with or directly in contact with the third electrode RME3 in the sub-region SA through the third contact portion CT3 penetrating the lower insulating layer RPAS, and the fourth connection electrode CNE4 may be in contact with the fourth electrode RME4 in the sub-region SA through the fourth contact portion CT4 penetrating the lower insulating layer RPAS.

However, the disclosure is not limited thereto. In an embodiment, in the display device 10, some or a number of the connection electrodes CNE may be connected to or directly connected to the third conductive layer. For example, the first connection electrode CNE1 and the second connection electrode CNE2 that are first type connection electrodes may be connected to or directly connected to the third conductive layer and may not be electrically connected to the electrode RME. A second type connection electrode and a third type connection electrode may not be electrically connected to the electrode RME, and may be connected only to the light emitting elements ED.

The first connection electrode CNE1 and the second connection electrode CNE2 may be the first type connection electrodes connected to the electrodes RME1 and RME2 connected to or directly connected to the third conductive layer, respectively. The third connection electrode CNE3 and the fourth connection electrode CNE4 may be the second type connection electrodes connected to the electrodes RME3 and RME4 that are not connected to the third conductive layer. The fifth connection electrode CNE5 may be the third type connection electrode that is not connected to the electrode RME. The fifth connection electrode CNE5 may be in contact with the light emitting elements ED without being connected to the electrode RME and may constitute an electrical connection circuit of the light emitting elements ED together with other connection electrodes CNE.

The third connection electrode CNE3 and the fourth connection electrode CNE4 that are the second type connection electrodes may be connection electrodes in which electrode extension portions extending in the first direction DR1 are not parallel with each other in the second direction DR2. The fifth connection electrode CNE5 that is the third type connection electrode may be the connection electrode in which electrode extension portions extending in the first direction DR1 are parallel with each other in the second direction DR2. The third connection electrode CNE3 and the fourth connection electrode CNE4 may have a shape that is bent while extending in the first direction DR1, and the fifth connection electrode CNE5 may have a shape surrounding a part of another connection electrode.

The light emitting elements ED may be classified into different light emitting elements ED depending on the connection electrodes CNE to be in contact with both ends of the light emitting elements ED to correspond to the arrangement structure of the connection electrodes CNE. The first light emitting element ED1 and the second light emitting element ED2 may have first ends in contact with the first type connection electrodes and second ends in contact with the second type connection electrodes. The first light emitting element ED1 may be in contact with the first connection electrode CNE1 and the third connection electrode CNE3, and the second light emitting element ED2 may be in contact with the second connection electrode CNE2 and the fourth connection electrode CNE4. The third light emitting element ED3 and the fourth light emitting element ED4 may have first ends in contact with the second type connection electrodes and second ends in contact with the third type connection electrodes. The third light emitting element ED3 may be in contact with the third connection electrode CNE3 and the fifth connection electrode CNE5, and the fourth light emitting element ED4 may be in contact with the fourth connection electrode CNE4 and the fifth connection electrode CNE5.

The light emitting elements ED may be connected in series through the connection electrodes CNE. Since the display device 10 according to the embodiment may include a larger number of light emitting elements ED for each sub-pixel SPXn and the light emitting elements ED are connected in series, the light emission amount per unit area may be further increased.

Figure 27:
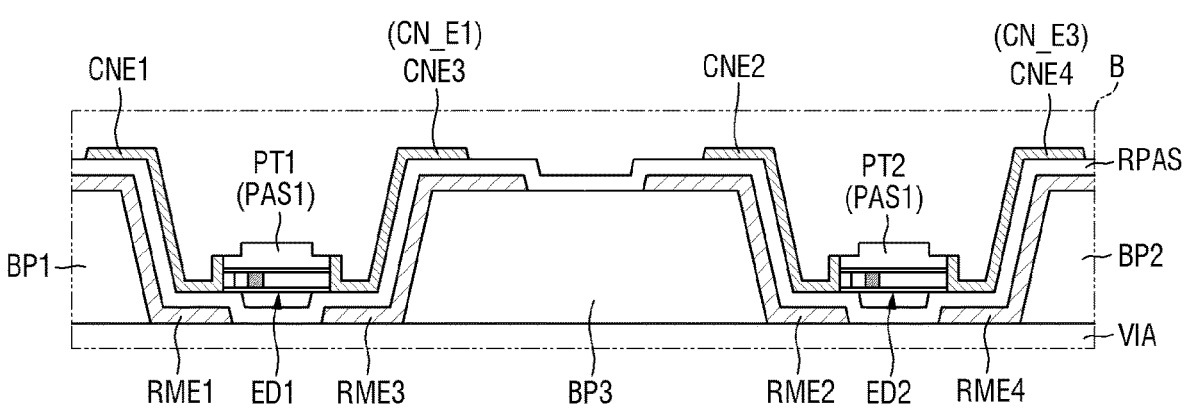
FIG. 27 is an enlarged view of part B of FIG. 24.

FIG. 27 is an enlarged view of part B of FIG. 24.

Referring to FIG. 27, the first insulating layer PAS1 may include a first insulating pattern PT1 disposed on the first light emitting element ED1 and a second insulating pattern PT2 disposed on the second light emitting element ED2. The first insulating pattern PT1 may be disposed between the first barrier wall BP1 and the third barrier wall BP3, and may extend in the first direction DR1 while covering the first light emitting elements ED1. The first insulating pattern PT1 may cover the third light emitting elements ED3 parallel to the first light emitting element ED1 in the first direction DR1. The second insulating pattern PT2 may be disposed between the third barrier wall BP3 and the second barrier wall BP2, and may be extend in the first direction DR1 while covering the second light emitting elements ED2. The second insulating pattern PT2 may also cover the fourth light emitting elements ED4 parallel to the second light emitting element ED2 in the first direction DR1.

The first insulating pattern PT1 may be in contact with the first electrode RME1 and the connection electrode CNE disposed on the third electrode RME3. For example, the first side surface of the first insulating pattern PT1 may be in contact with the first connection electrode CNE1 and a second extension portion CN_E2 of the third connection electrode CNE3, and the second side surface thereof may be in contact with a first extension portion CN_E1 of the third connection electrode CNE3 and a fifth extension portion CN_E5 of the fifth connection electrode CNE5. The top surface of the first insulating pattern PT1 may be in contact with a first connection portion CN_B1 of the third connection electrode CNE3.

The second insulating pattern PT2 may be in contact with and the connection electrode CNE disposed on the fourth electrode RME4 and the second electrode RME2. For example, the first side surface of the second insulating pattern PT2 may be in contact with the second connection electrode CNE2 and a fourth extension portion CN_E4 of the fourth connection electrode CNE4, and the second side surface thereof may be in contact with a third extension portion CN_E3 of the fourth connection electrode CNE4 and a sixth extension portion CN_E6 of the fifth connection electrode CNE5. The top surface of the second insulating pattern PT2 may be in contact with a second connection portion CN_B2 of the fourth connection electrode CNE4.

Similar to the above-described embodiment, the first insulating pattern PT1 and the second insulating pattern PT2 of the first insulating layer PAS1 may include portions with different thicknesses. Each of the first insulating pattern PT1 and the second insulating pattern PT2 may have a thick portion (for example, a second portion) disposed at the center thereof, and a thin portion (for example, a first portion) disposed at an outer side. Each of the insulating patterns PT1 and PT2 may have a shape with a central portion thereof protruding higher than an outer portion thereof.

In the first insulating pattern PT1 and the second insulating pattern PT2, the thick portion may not necessarily be located at the center but may be biased to one side or a side. The first insulating pattern PT1 and the second insulating pattern PT2 may be formed in a same process and may have a same shape. For example, in an embodiment in which the thick portion of the first insulating pattern PT1 is biased to one side or a side, the thick portion of the second insulating pattern PT2 may also have a shape equally biased to one side or a side.

Figure 28:
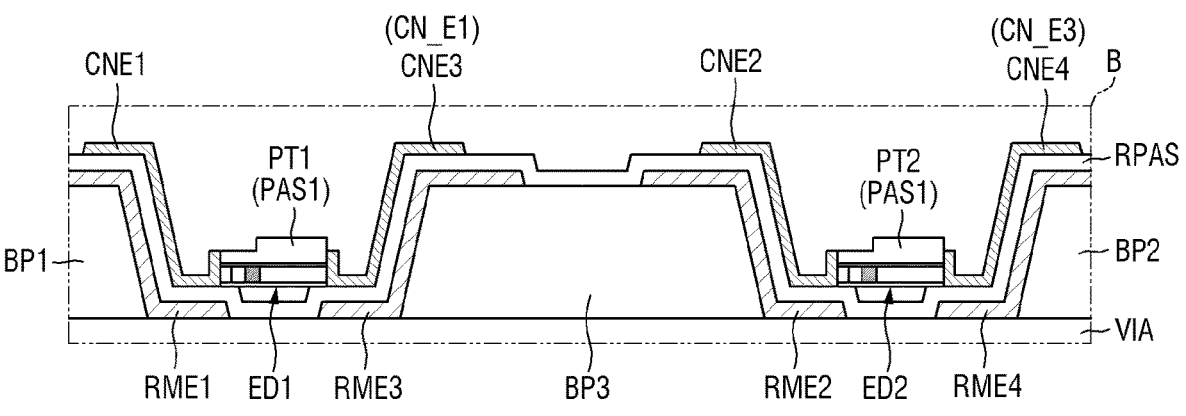
FIG. 28 is a schematic cross-sectional view illustrating a portion of a display device according to an embodiment.

FIG. 28 is a schematic cross-sectional view illustrating a portion of a display device according to an embodiment.

Referring to FIG. 28, in the first insulating pattern PT1 and the second insulating pattern PT2, the thick portion (for example, the second portion) may not be located at the center thereof, and the thin portion (for example, the first portion) may be disposed at one side or a side and the thick portion may be disposed at the other side.

The first insulating pattern PT1 may be in contact with the connection electrode CNE disposed on the third electrode RME3 and the first electrode RME1. For example, the first side surface of the first insulating pattern PT1 may be in contact with the first connection electrode CNE1 and the second extension portion CN_E2 of the third connection electrode CNE3, and the second side surface thereof may be in contact with the first extension portion CN_E1 of the third connection electrode CNE3 and the fifth extension portion CN_E5 of the fifth connection electrode CNE5. Furthermore, the top surface of the first insulating pattern PT1 may be in contact with the first connection portion CN_B1 of the third connection electrode CNE3. The first side surface of the first insulating pattern PT1 may be a side surface of the thin portion, and the second side surface may be a side surface of the thick portion.

The second insulating pattern PT2 may be in contact with the connection electrode CNE disposed on the fourth electrode RME4 and the second electrode RME2. For example, the second side surface of the second insulating pattern PT2 may be in contact with the second connection electrode CNE2 and the fourth extension portion CN_E4 of the fourth connection electrode CNE4, and the second side surface thereof may be in contact with the third extension portion CN_E3 of the fourth connection electrode CNE4 and the sixth extension portion CN_E6 of the fifth connection electrode CNE5. The top surface of the second insulating pattern PT2 may be in contact with the second connection portion CN_B2 of the fourth connection electrode CNE4. The first side surface of the second insulating pattern PT2 may be a side surface of the thin portion, and the second side surface may be a side surface of the thick portion.

Figure 29:
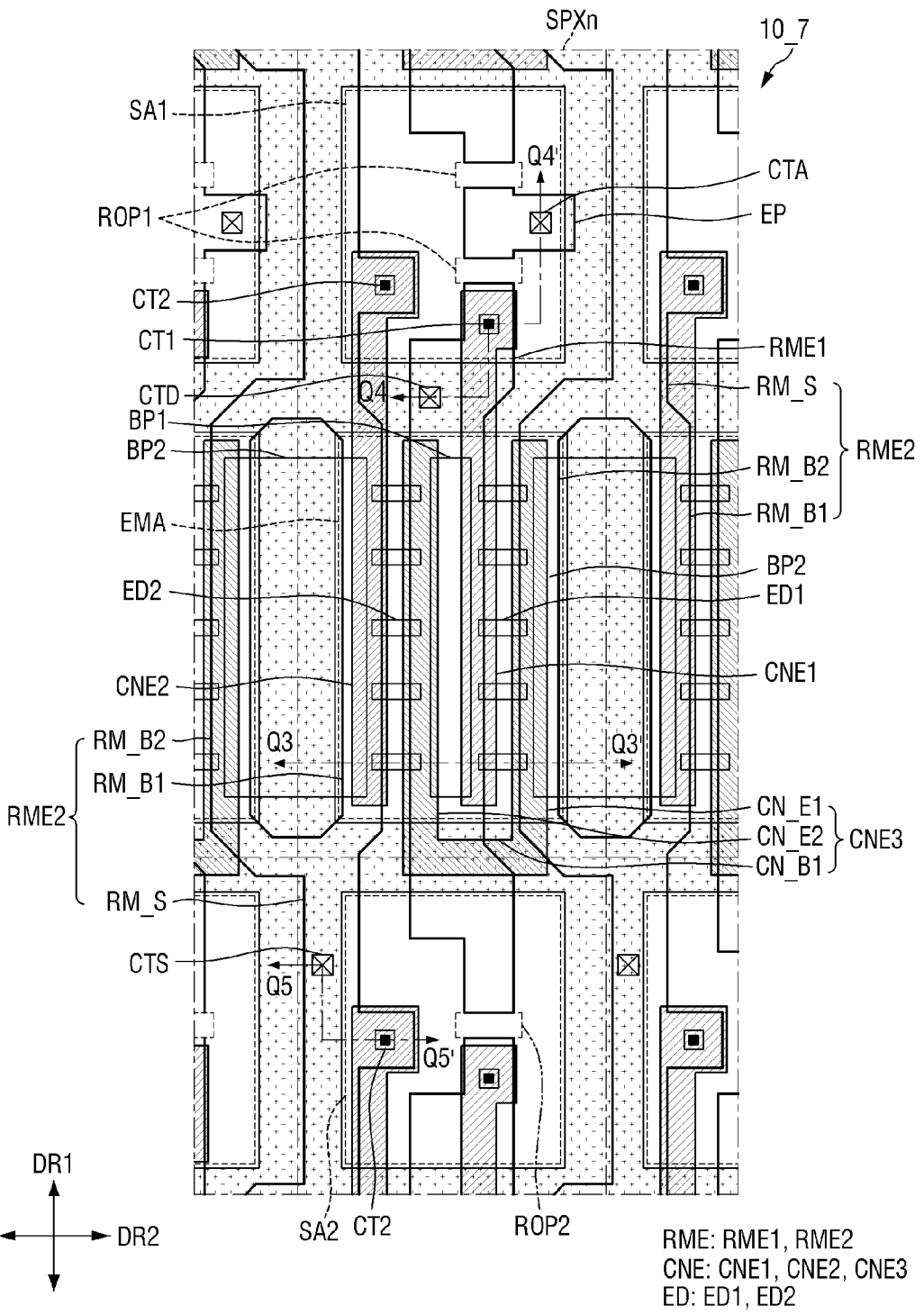
FIG. 29 is a schematic plan view illustrating a sub-pixel of a display device according to an embodiment.
Figure 30:
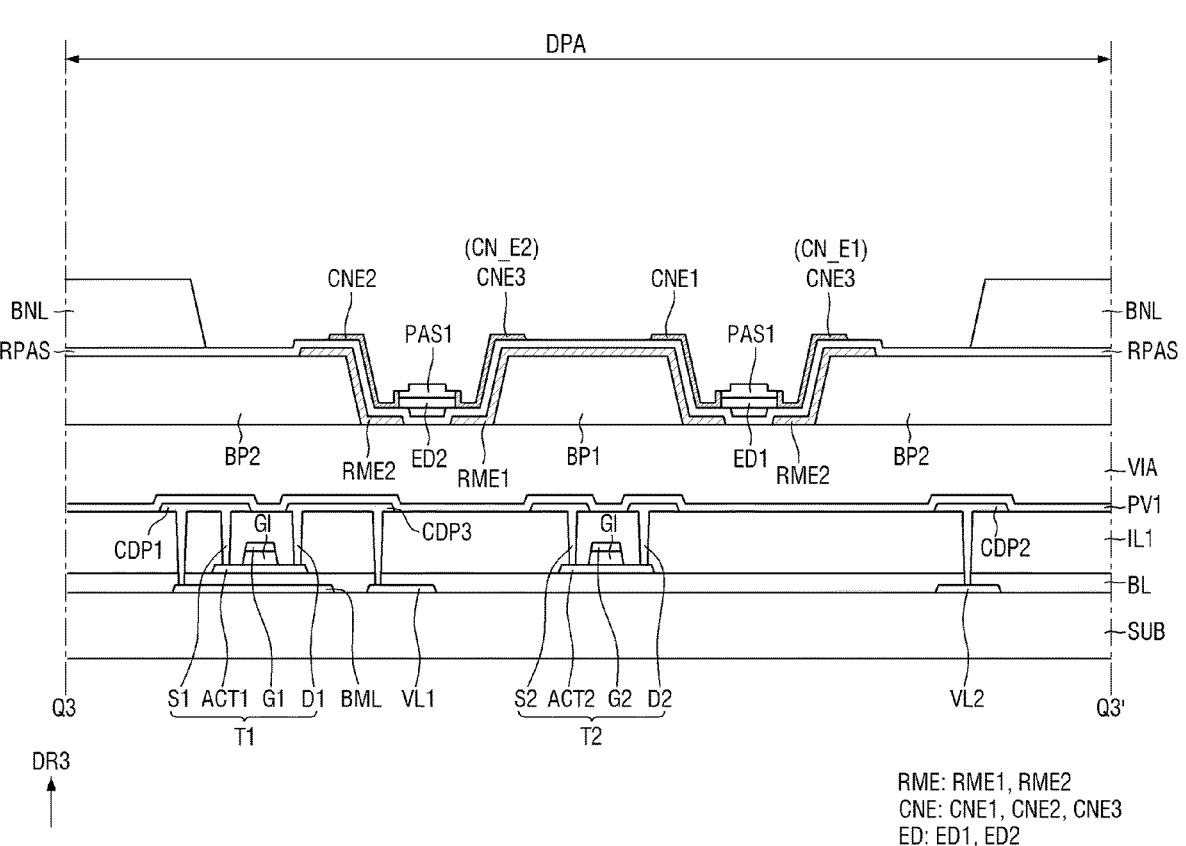
FIG. 30 is a schematic cross-sectional view taken along line Q3-Q3' in FIG. 29.
Figure 31:
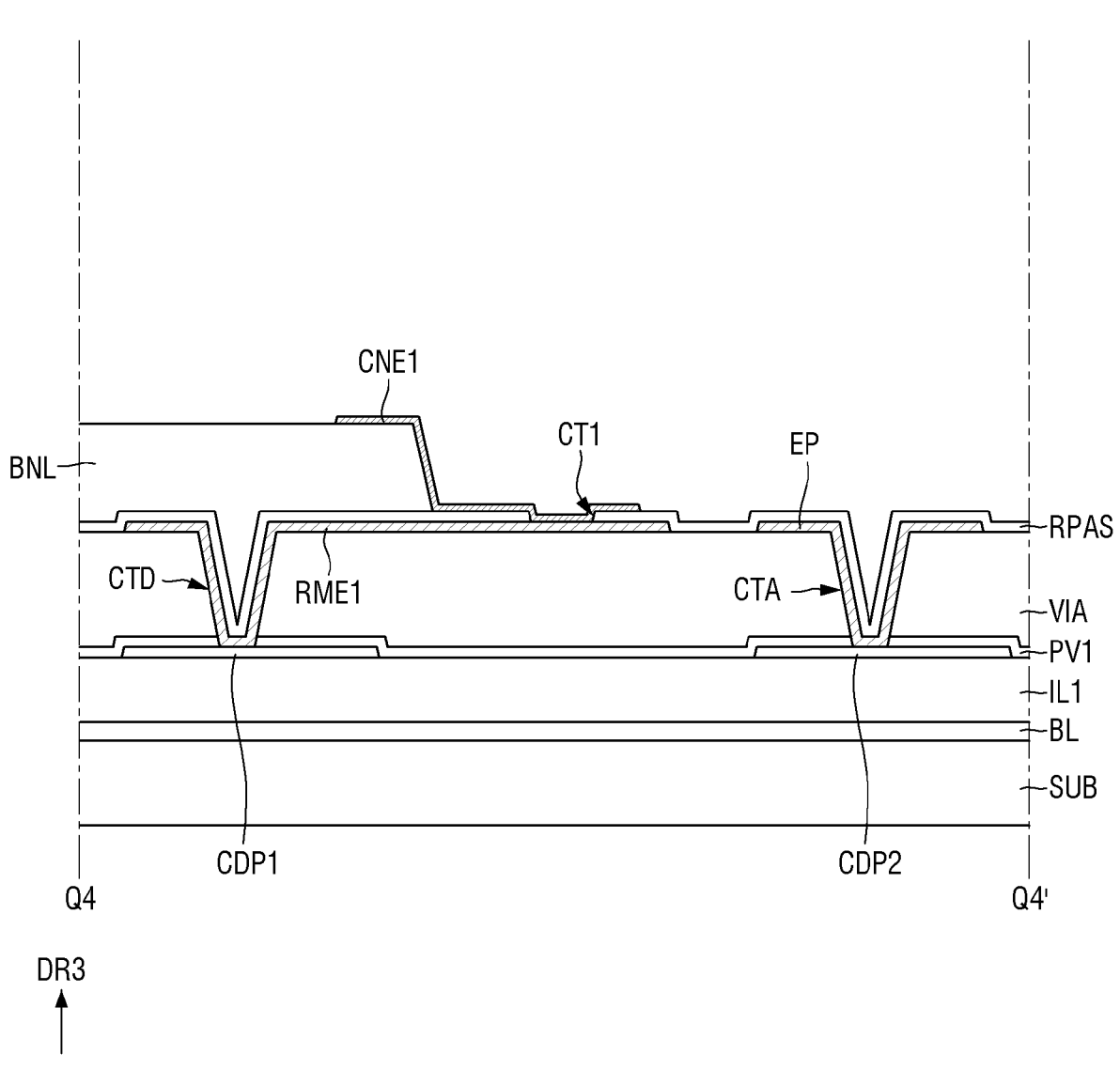
FIG. 31 is a schematic cross-sectional view taken along line Q4-Q4' in FIG. 29.
Figure 32:
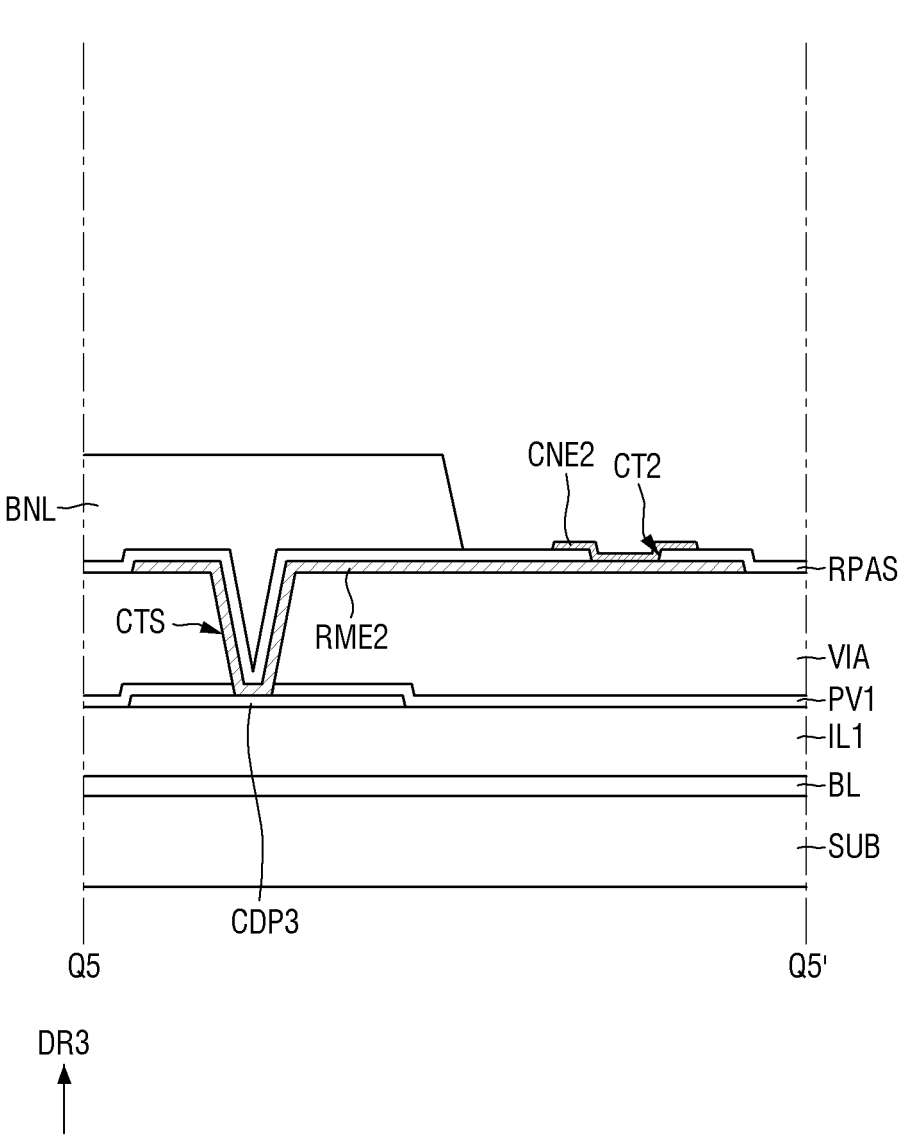
FIG. 32 is a schematic cross-sectional view taken along line Q5-Q5' of FIG. 29.

FIG. 29 is a schematic plan view illustrating a sub-pixel of a display device according to an embodiment. FIG. 30 is a schematic cross-sectional view taken along line Q3-Q3' in FIG. 29. FIG. 31 is a schematic cross-sectional view taken along line Q4-Q4' in FIG. 29. FIG. 32 is a schematic cross-sectional view taken along line Q5-Q5' of FIG. 29.

FIG. 29 illustrates planar arrangement of the electrodes RME (RME1 and RME2), the barrier walls BP1 and BP2, the bank layer BNL, the light emitting elements ED1 and ED2, and the connection electrodes CNE (CNE1, CNE2, and CNE3) disposed in one sub-pixel SPXn of a display device 10_7. FIG. 30 illustrates a cross section crossing or intersecting both ends of the light emitting elements ED1 and ED2 disposed on different electrodes RME1 and RME2. FIGS. 31 and 32 illustrate cross sections across electrode contact holes CTD, CTS, and CTA, and the contact portions CT1 and CT2.

Referring to FIGS. 29 to 32, in the display device 10_7 according to an embodiment, the structures of the electrode RME, the connection electrode CNE, and the barrier walls BP1 and BP2 may be different from those in the above-described embodiments. Hereinafter, the redundant description of the above-described embodiments will be omitted while focusing on differences.

The barrier walls BP1 and BP2 may have a shape extending in the first direction DR1, and may have different widths measured in the second direction DR2. Any one of the barrier walls BP1 and BP2 may be disposed across the sub-pixels SPXn adjacent in the second direction DR2. For example, the barrier walls BP1 and BP2 may include the first barrier wall BP1 disposed in the emission area EMA of each sub-pixel SPXn and the second barrier wall BP2 disposed across the emission areas EMA of different sub-pixels SPXn.

The first barrier wall BP1 is disposed in the center of the emission areas EMA, and the second barrier walls BP2 are disposed to be spaced apart from the first bank pattern BP1 interposed therebetween. The first barrier wall BP1 and the second barrier wall BP2 may be alternately disposed along the second direction DR2. The light emitting elements ED may be disposed between the first barrier wall BP1 and the second barrier wall BP2 spaced apart from each other.

The first barrier wall BP1 and the second barrier wall BP2 may have a same length in the first direction DR1, but may have different widths measured in the second direction DR2. In the bank layer BNL, a portion extending in the first direction DR1 may overlap the second barrier wall BP2 in the thickness direction. The first barrier wall BP1 may be disposed to overlap the first electrode RME1, and the second barrier wall BP2 may be disposed to overlap electrode branch portions RM_B1 and RM_B2 of the second electrode RME2 and the bank layer BNL.

The first barrier wall BP1 and the second barrier wall BP2 may have a same length in the first direction DR1, but may have different widths measured in the second direction DR2. In the bank layer BNL, a portion extending in the first direction DR1 may overlap the second barrier wall BP2 in the thickness direction. The barrier walls BP1 and BP2 may be disposed in an island-like pattern on the entire surface of the display area DPA.

The electrodes RME include the first electrode RME1 disposed at the central portion of each sub-pixel SPXn and the second electrode RME2 disposed across different sub-pixels SPXn. The first electrode RME1 and the second electrode RME2 may substantially have a shape extending in the first direction DR1, and the portions of the first electrode RME1 and the second electrode RME2 disposed in the emission area EMA may have different shapes.

The first electrode RME1 may be disposed at the center of the sub-pixel SPXn, and the portion of the first electrode RME1 disposed in the emission area EMA may be disposed on the first barrier wall BP1. The first electrode RME1 may extend from the sub-region SA in the first direction DR1 to the sub-region SA of another sub-pixel SPXn. The first electrode RME1 may have a shape in which the width measured in the second direction DR2 changes depending on positions, and at least a portion of the first electrode RME1 overlapping the first barrier wall BP1 in the emission area EMA may have a width greater than that of the first barrier wall BP1.

The second electrode RME2 may include a portion extending in the first direction DR1 and portions branched near the emission area EMA. In one embodiment, the second electrode RME2 may include an electrode stem portion RM_S extending in the first direction DR1, the electrode branch portions RM_B1 and RM_B2 branched from the electrode stem portion RM_S to be bent in the second direction DR2 and extending in the first direction DR1 again. The electrode stem portion RM_S may be disposed to overlap the portion of the bank layer BNL extending in the first direction DR1, and may be disposed at one side or a side in the second direction DR2 of the sub-region SA. The electrode branch portions RM_B1 and RM_B2 may be branched from the electrode stem portion RM_S disposed at the portion of the bank layer BNL extending in the first direction DR1 and the portion of the bank layer BNL extending in the second direction DR2, and may be bent toward both sides in the second direction DR2. The electrode branch portions RM_B1 and RM_B2 may be disposed across the emission area EMA in the first direction DR1, and may be bent again to be integrally connected to the electrode stem portion RM_S. For example, the electrode branch portions RM_B1 and RM_B2 of the second electrode RME2 may be branched on the upper side of the emission area EMA of any one sub-pixel SPXn, and may be connected to each other again on the lower side thereof.

The second electrode RME2 may include a first electrode branch portion RM_B1 disposed on the left side of the first electrode RME1 and a second electrode branch portion RM_B2 disposed on the right side of the first electrode RME1. The electrode branch portions RM_B1 and RM_B2 included in one second electrode RME2 may be disposed in the emission areas EMA of the sub-pixels SPXn adjacent in the second direction DR2, and the electrode branch portions RM_B1 and RM_B2 of different second electrodes RME2 may be disposed in one sub-pixel SPXn. The first electrode branch portion RM_B1 of the second electrode RME2 may be disposed on the left side of the first electrode RME1, and the second electrode branch portion RM_B2 of another second electrode RME2 may be disposed on the right side of the first electrode RME1.

The electrode branch portions RM_B1 and RM_B2 of the second electrode RME2 may overlap one side or a side of the second barrier wall BP2. The first electrode branch portion RM_B1 may partially overlap the second first electrode BP2 disposed on the left side of the first barrier wall BP1, and the second electrode branch portion RM_B2 may partially overlap the second barrier wall BP2 disposed on the right side of the first barrier wall BP1. Both sides of the first electrode RME1 may face and be spaced apart from different electrode branch portions RM_B1 and RM_B2 of different second electrodes RME2, and the gap between the first electrode RME1 and each of the electrode branch portions RM_B1 and RM_B2 may be smaller than the gap between different barrier walls BP1 and BP2.

The width of the first electrode RME1 measured in the second direction DR2 may be greater than the widths of the electrode stem portion RM_S and the electrode branch portions RM_B1 and RM_B2 of the second electrode RME2. The first electrode RME1 may have a width greater than that of the first barrier wall BP1 and overlap both sides of the first bank pattern BP1, whereas the second electrode RME2 may have a relatively small width so that the electrode branch portions RM_B1 and RM_B2 may overlap only one side or a side of the second barrier wall BP2.

The first electrode RME1 may be in contact with the first conductive pattern CDP1 of the third conductive layer through the first electrode contact hole CTD at the portion overlapping the portion of the bank layer BNL extending in the second direction DR2. The second electrode RME2 may be in contact with the second voltage line VL2 of the third conductive layer through the second electrode contact hole CTS at the electrode stem portion RM_S. The portion of the first electrode RME1 disposed in the sub-region SA may be disposed to overlap the first contact portion CT1. The second electrode RME2 may have a portion that protrudes from the electrode stem portion RM_S in the second direction DR2 to be disposed in the sub-region SA, and the second electrode RME2 may overlap the second contact portion CT2 at the protruding part.

Between the first electrode RME1 and the second electrode RME2, the first electrode RME1 may extend to separation portions ROP1 and ROP2 of the sub-region SA, whereas the second electrode RME2 may not be separated in the sub-region SA. One second electrode RME2 may include electrode stem portions RM_S and the electrode branch portions RM_B1 and RM_B2, and may have a shape extending in the first direction DR1 and branched near the emission area EMA of each sub-pixel SPXn. The first electrode RME1 may be disposed between the separation portions ROP1 and ROP2 disposed in different sub-regions SA1 and SA2 of each sub-pixel SPXn and may be disposed across the emission area EMA.

In accordance with one embodiment, the display device 10 may include a wire connection electrode EP disposed between the first electrodes RME1 of different sub-pixels SPXn in the first sub-region SA1 among the sub-regions SA1 and SA2 of each sub-pixel SPXn. The wire connection electrode EP may not be disposed in the second sub-region SA of the sub-pixel SPXn, and the first electrodes RME1 of different sub-pixels SPXn adjacent in the first direction DR1 may be spaced apart from each other. In the sub-pixel SPXn illustrated in FIG. 22 among the sub-pixels SPXn, the first sub-region SA1 in which the wire connection electrode EP is disposed may be disposed on the upper side of the emission area EMA, and the second sub-region SA2 may be disposed on the lower side of the emission area EMA. On the other hand, in the sub-pixel SPXn adjacent to the sub-pixel SPXn of FIG. 29 in the first direction DR1, the first sub-region SA1 in which the wire connection electrode EP is disposed may be disposed on the lower side of the emission area EMA, and the second sub-region SA2 may be disposed on the upper side of the emission area EMA.

The first electrode RME1 may be spaced apart from the wire connection electrode EP with the first separation part ROP1 interposed therebetween in the first sub-region SAL Two first separation portions ROP1 may be disposed in one first sub-region SAL The wire connection electrode EP may be spaced apart from the first electrode RME1 disposed in the corresponding sub-pixel SPXn with a lower first separation portion ROP1 interposed therebetween, and may be spaced apart from the first electrode RME1 disposed in another sub-pixel SPXn with an upper first separation portion ROP1 interposed therebetween. One second separation portion ROP2 may be disposed in the second sub-region SA2, and different first electrodes RME1 may be spaced apart from each other in the first direction DR1.

In one embodiment, the wire connection electrode EP may be connected to the first voltage line VL1 of the third conductive layer through the third electrode contact hole CTA penetrating the via layer VIA. The first electrode RME1 may be connected to the wire connection electrode EP, and the electric signal applied to arrange the light emitting elements ED may be applied from the first voltage line VL1 to the first electrode RME1 through the wire connection electrode EP. In the process of arranging the light emitting elements ED, signals may be applied to the first voltage line VL1 and the second voltage line VL2, and may be transmitted to the first electrode RME1 and the second electrode RME2.

A relative arrangement of the second electrode contact hole CTS may be different from that of the third electrode contact hole CTA. The second electrode contact hole CTS may be disposed at the portion of the bank layer BNL surrounding the second sub-region SA2, and the third electrode contact hole CTA may be disposed in the first sub-region SA1. Since the second electrode contact hole CTS and the third electrode contact hole CTA expose the top surfaces of different voltage lines VL1 and VL2, respectively, the positions of the electrode contact holes may be determined to correspond thereto.

The bank layer BNL may surround the emission area EMA and the sub-regions SA1 and SA2 similar to the above-described embodiment. However, in the embodiment in which the display device 10 may include the sub-regions SA1 and SA2 distinguished from each other, the areas surrounded by the bank layer BNL may be distinguished from each other. The bank layer BNL is the same as that in the above-described embodiment except that it surrounds different sub-regions SA1 and SA2.

The light emitting elements ED may be disposed on different electrodes RME between different barrier walls BP1 and BP2. The light emitting element ED may include the first light emitting element ED1 having both ends disposed on the first electrode RME1 and the second electrode branch portion RM_B2 of the second electrode RME2, and the second light emitting element ED2 having both ends disposed on the first electrode RME1 and the first electrode branch portion RM_B1 of another second electrode RME2. The first light emitting elements ED1 may be disposed on the right side with respect to the first electrode RME1, and the second light emitting elements ED2 may be disposed on the left side with respect to the first electrode RME1. The first light emitting elements ED1 may be disposed on the first electrode RME1 and the second electrode RME2, and the second light emitting elements ED2 may be disposed on the first electrode RME1 and the second electrode RME2.

The connection electrodes CNE (CNE1, CNE2, and CNE3) may include a first connection electrode CNE1, a second connection electrode CNE2, and a third connection electrode CNE3.

The first connection electrode CNE1 may have a shape extending in the first direction DR1 and may be disposed on the first electrode RME1. A portion of the first connection electrode CNE1 disposed on the first barrier wall BP1 may overlap the first electrode RME1, and may extend therefrom in the first direction DR1 to be disposed in the first sub-region SA1 located on the upper side of the emission area EMA over the bank layer BNL. The first connection electrode CNE1 may be in contact with the first electrode RME1 through the first contact portion CT1 in the first sub-region SAL The second connection electrode CNE2 may have a shape extending in the first direction DR1 and may be disposed on the second electrode RME2. A portion of the second connection electrode CNE2 disposed on the second barrier wall BP2 may overlap the second electrode RME2, and may extend therefrom in the first direction DR1 to be disposed in the first sub-region SA1 located on the upper side of the emission area EMA over the bank layer BNL. The second connection electrode CNE2 may be in contact with the second electrode RME2 through the second contact portion CT2 in the first sub-region SAL In the sub-pixel SPXn adjacent to the sub-pixel SPXn of FIG. 29 in the first direction DR1, the first connection electrode CNE1 and the second connection electrode CNE2 may be in contact with the first electrode RME1 and the second electrode RME2 through the contact portions CT1 and CT2 disposed in the second sub-region SA2, respectively.

The third connection electrode CNE3 may include the extension portions CN_E1 and CN_E2 extending in the first direction DR1 and a first connection portion CN_B1 connecting the extension portions CN_E1 and CN_E2. The first extension portion CN_E1 may be disposed on the second electrode branch portion RM_B2 of the second electrode RME2 while facing the first connection electrode CNE1 in the emission area EMA, and the second extension portion CN_E2 may be disposed on the first electrode RME1 while facing the second connection electrode CNE2 in the emission area EMA. The first connection portion CN_B1 may extend in the second direction DR2 on the bank layer BNL disposed on the lower side of the emission area EMA to connect the first extension portion CN_E1 to the second extension portion CN_E2. The third connection electrode CNE3 may be disposed on the emission area EMA and the bank layer BNL, and may not be directly connected to the electrode RME. The second electrode branch portion RM_B2 disposed under or below the first extension portion CN_E1 may be electrically connected to the second voltage line VL2, and the second power voltage applied to the second electrode branch portion RM_B2 may not be transmitted to the third connection electrode CNE3.

In concluding the detailed description, those skilled in the art will appreciate that many variations and modifications can be made to the embodiments without departing from the principles of the disclosure. Therefore, the disclosed embodiments are used in a generic and descriptive sense only and not for purposes of limitation.

What is claimed is:

1. A display device comprising:
a first electrode and a second electrode spaced apart from the first electrode in a second direction;
light emitting elements disposed on the first electrode and the second electrode;
a first insulating layer disposed on the light emitting elements;
a first connection electrode disposed on the first electrode and electrically contacting each of the light emitting elements; and
a second connection electrode disposed on the second electrode and electrically contacting each of the light emitting elements, wherein
the first insulating layer comprises a first portion and a second portion,
each of the first portion and the second portion of the first insulating layer have a planar upper surface above the light emitting elements, and
the planar upper surface of the second portion of the first insulating layer is farther from the light emitting elements than the planar upper surface of the first portion of the first insulating layer.

2. The display device of claim 1, wherein a width of the first insulating layer is equal to or less than a length of each of the light emitting elements.

3. The display device of claim 1, further comprising:
a second insulating layer disposed on the first insulating layer,
wherein the first connection electrode contacts the first insulating layer and the second insulating layer.

4. The display device of claim 1, further comprising:
a first barrier wall that overlaps the first electrode in a plan view, and a second barrier wall that overlaps the second electrode in a plan view,
wherein the light emitting elements and the first insulating layer are disposed between the first barrier wall and the second barrier wall.

5. The display device of claim 1, further comprising:
a lower insulating layer disposed on the first electrode and the second electrode, wherein
the light emitting elements are disposed directly on the lower insulating layer.

6. A display device comprising:
a first electrode and a second electrode spaced apart from the first electrode in a second direction;
light emitting elements disposed on the first electrode and the second electrode;
a first insulating layer disposed on the light emitting elements;
a first connection electrode disposed on the first electrode and electrically contacting each of the light emitting elements; and
a second connection electrode disposed on the second electrode and electrically contacting each of the light emitting elements, wherein
the first insulating layer comprises a first portion and a second portion having a thickness larger than a thickness of the first portion of the first insulating layer, and
a width of the second portion of the first insulating layer is less than a width of the first insulating layer.

7. The display device of claim 6, wherein
the second portion of the first insulating layer is disposed at a center of the first insulating layer, and
the first portion is disposed on each of both sides of the second portion of the first insulating layer.

8. The display device of claim 7, wherein
the first connection electrode electrically contacts a side surface of a first end of each of the light emitting elements, and a first side surface of the first portion, and
the second connection electrode electrically contacts a side surface of a second end of each of the light emitting elements, and a second side surface of the first portion of the first insulating layer.

9. The display device of claim 7, wherein a part of each of the first connection electrode and the second connection electrode is disposed on the first portion of the first insulating layer and spaced apart from the second portion of the first insulating layer.

10. The display device of claim 6, wherein the second portion of the first insulating layer is disposed on a side in the second direction from a center of the second direction.

11. The display device of claim 10, wherein
the first connection electrode electrically contacts a side surface of a first end of each of the light emitting elements and the first portion, and
the second connection electrode electrically contacts a side surface of a second end of each of the light emitting elements and the second portion of the first insulating layer.

12. The display device of claim 6, wherein the first insulating layer includes a third portion having a thickness larger than a thickness of the second portion and having a width less than a width of the second portion of the first insulating layer.

13. A display device comprising:
a first electrode and a second electrode spaced apart from the first electrode in a second direction;
light emitting elements disposed on the first electrode and the second electrode;
a first insulating layer disposed on the light emitting elements;
a first connection electrode disposed on the first electrode and electrically contacting each of the light emitting elements;
a second connection electrode disposed on the second electrode and electrically contacting each of the light emitting elements;
a third electrode disposed between the first electrode and the second electrode; and
a fourth electrode spaced apart from the second electrode in the second direction, wherein
the first insulating layer comprises a first portion and a second portion having a thickness larger than a thickness of the first portion of the first insulating layer,
the light emitting elements comprise:
a first light emitting element disposed on the first electrode and the third electrode; and
a second light emitting element disposed on the second electrode and the fourth electrode, and
the first insulating layer comprises:
a first insulating pattern disposed on the first light emitting element; and
a second insulating pattern disposed on the second light emitting element.

14. The display device of claim 13, wherein the second portion is disposed at a center of the first insulating layer in each of the first insulating pattern and the second insulating pattern.

15. The display device of claim 13, wherein the second portion is disposed on a side in the second direction from a center in each of the first insulating pattern and the second insulating pattern.

* * * * *